(12) United States Patent
Yokota et al.

(10) Patent No.: US 9,459,058 B2
(45) Date of Patent: Oct. 4, 2016

(54) HEAT SINK AND METHOD FOR MANUFACTURING HEAT SINK

(75) Inventors: Yoshihiro Yokota, Hyogo (JP); Kenichi Inoue, Hyogo (JP); Koji Inoue, Hyogo (JP); Kyoji Zaitsu, Hyogo (JP); Koichi Makii, Aichi (JP)

(73) Assignee: Kobe Steel, Ltd., Hyogo (JP)

( * ) Notice: Subject to any disclaimer, the term of this patent is extended or adjusted under 35 U.S.C. 154(b) by 390 days.

(21) Appl. No.: 14/236,011

(22) PCT Filed: Jul. 26, 2012

(86) PCT No.: PCT/JP2012/004767
§ 371 (c)(1),
(2), (4) Date: Jan. 29, 2014

(87) PCT Pub. No.: WO2013/018329
PCT Pub. Date: Feb. 7, 2013

(65) Prior Publication Data
US 2014/0224467 A1 Aug. 14, 2014

(30) Foreign Application Priority Data

Jul. 29, 2011 (JP) ................................ 2011-166400
Jan. 18, 2012 (JP) ................................ 2012-007954

(51) Int. Cl.
*F28F 21/08* (2006.01)
*H01L 23/36* (2006.01)
(Continued)

(52) U.S. Cl.
CPC .............. *F28F 21/08* (2013.01); *B21C 23/002* (2013.01); *B21C 23/007* (2013.01); *B21C 23/22* (2013.01);
(Continued)

(58) Field of Classification Search
CPC ..... H01L 23/36; H01L 23/37; H01L 23/367; H01L 23/3672; H01L 23/3735; H01L 23/3736; H01L 23/3675; H01L 23/492; H01L 23/32; H01L 23/34; H01L 23/4332; H01L 2023/4068; H01L 2023/4081; H01L 2924/1305; H01L 2924/13033; H01L 2924/13055; H01L 2924/13001; H01L 2924/1301; H01L 2924/13091; F28F 21/08; B21C 23/007; B21C 23/22; B21C 23/002; B23P 15/26; H05K 7/20409

See application file for complete search history.

(56) References Cited

U.S. PATENT DOCUMENTS 4,415,025 A * 11/1983 Horvath ............. H01L 23/3672
165/185
4,716,258 A * 12/1987 Murtha ................. H01L 31/052
136/246

(Continued)

FOREIGN PATENT DOCUMENTS

EP    1995774 A2    11/2008
JP    2006-054230 A    2/2006

(Continued)

OTHER PUBLICATIONS

International Search Report; PCT/JP2012/004767; Oct. 30, 2012.
(Continued)

*Primary Examiner* — Tho V Duong
(74) *Attorney, Agent, or Firm* — Studebaker & Brackett PC

(57) ABSTRACT

This heat sink has bonded on one surface a member to be bonded, and has a cooling member in contact with the other surface. The heat sink is provided with a metal plate having a thermal expansion coefficient larger than that of the member to be bonded, and the metal plate is provided with a center portion where the member to be bonded is bonded, and a plurality of linear peripheral slits formed in a whirl-like radial manner such that the linear peripheral slits surround the center portion.

14 Claims, 14 Drawing Sheets

(51) Int. Cl.
*H01L 23/373* (2006.01)
*B21C 23/00* (2006.01)
*B23P 15/26* (2006.01)
*B21C 23/22* (2006.01)

(52) U.S. Cl.
CPC ............... *B23P 15/26* (2013.01); *H01L 23/36* (2013.01); *H01L 23/3735* (2013.01); *H01L 23/3736* (2013.01); *H01L 2224/32225* (2013.01); *H01L 2924/1301* (2013.01); *H01L 2924/1305* (2013.01); *H01L 2924/13033* (2013.01); *H01L 2924/13055* (2013.01); *H01L 2924/13091* (2013.01); *Y10T 29/49826* (2015.01)

(56) References Cited

U.S. PATENT DOCUMENTS

| | | | | |
|---|---|---|---|---|
| 5,159,531 A | * | 10/1992 | Horvath | H01L 23/3672 165/185 |
| 5,229,914 A | * | 7/1993 | Bailey | H01L 23/3672 165/181 |
| 5,270,902 A | * | 12/1993 | Bellar | H01L 23/3672 165/185 |
| 5,566,052 A | * | 10/1996 | Hughes | H01L 23/367 174/354 |
| 6,536,509 B1 | | 3/2003 | Koidl et al. | |
| 2006/0033202 A1 | | 2/2006 | Anzai | |
| 2008/0290499 A1 | | 11/2008 | Nishi et al. | |

FOREIGN PATENT DOCUMENTS

| | | |
|---|---|---|
| JP | 2007-141948 A | 6/2007 |
| JP | 2008-141154 A | 6/2008 |
| JP | 2011-003800 A | 1/2011 |
| JP | 2011-035219 A | 2/2011 |

OTHER PUBLICATIONS

Written Opinion of the International Searching Authority; PCT/JP2012/004767; Oct. 30, 2012.

* cited by examiner

HEAT SINK AND METHOD FOR MANUFACTURING HEAT SINK

TECHNICAL FIELD

The present invention relates to a heat sink to suppress deformation due to a difference in thermal expansion coefficient and a method for manufacturing a heat sink.

BACKGROUND ART

A semiconductor device including a semiconductor element-bearing substrate (1a, 1b) provided with a semiconductor element (3) and a heat sink (2) bonded to the substrate is described in FIG. 1, FIG. 2, and the like of PTL 1 below. In addition, technologies to form a slit and a groove in a heat sink are described in PTLs 2 to 4 below.

The semiconductor device described in PTL 1 below has a problem in that mountain-like thermal distortion occurs, which is a warp resulting from a difference in thermal expansion coefficient between the semiconductor element-bearing substrate and the heat sink, as described in the paragraph [0004] and FIG. 3 of PTL 1. In the state in which mountain-like thermal distortion has occurred, for example, such problems as described in the following items (i) and (ii) may occur.

(i) Firm fixation between the heat sink and a member which is bonded to the heat sink (hereafter referred to as a "member to be bonded") becomes difficult and, for example, an electronic part directly or indirectly bonded to the heat sink may be peeled.

(ii) The heat sink may be damaged by generation of a thermal stress between the heat sink and the member to be bonded.

A technology aiming at suppressing the above-described mountain-like thermal distortion and problems thereof will be described below.

PTL 1 describes a technology aiming at suppressing the mountain-like thermal distortion of a heat sink by appropriately selecting the material for solder to bond the heat sink to a semiconductor element-bearing substrate serving as a member to be bonded. However, in some cases, this technology cannot suppress the mountain-like thermal distortion sufficiently.

PTLs 2 to 4 describe technologies aiming at suppressing mountain-like thermal distortion by forming slits or grooves in a heat sink. These technologies aim at absorbing relaxing the mountain-like thermal distortion by dispersing the mountain-like thermal distortion, which is a wide-area distortion of the whole heat sink, into local distortions.

However, the technologies described in PTLs 2 and 3 have a problem in that thermal diffusion in the plate surface direction orthogonal to the plate thickness direction of the heat sink is hindered. For details, in the technology described in PTL 2 (refer to FIG. 2 and FIG. 3), a plurality of slit holes extending parallel to each other are disposed in the heat sink. Also, in the technology described in PTL 3 (refer to FIG. 1 and the like), arc slits along the circles centering on the center of the heat sink are disposed in the heat sink. According to these technologies, thermal diffusion in the direction crossing the slits may be hindered by the slits. If the thermal diffusion is hindered, as a result, insufficient suppression of the mountain-like thermal distortion of the heat sink may occur.

Meanwhile, in the technology described in PTL 4, the heat sink and the member to be bonded may be peeled. For details, in the technology described in PTL 4 (refer to FIG. 2, FIG. 4, and the like), grooves are disposed in the surface and the back of the heat sink alternately and, therefore, the grooves are arranged in, so to speak, a staggered configuration. In this technology, the mountain-like thermal distortion of the heat sink is absorbed relaxed by converting the mountain-like thermal distortion of the heat sink to bellows crease deformation of the heat sink and rotation of the center portion of the heat sink. However, a stress or strain, which induces peeling between the heat sink and the member to be bonded, may be generated by the bellows crease deformation of the heat sink.

CITATION LIST

Patent Literature

PTL 1: Japanese Unexamined Patent Application Publication No. 2007-141948
PTL 2: Japanese Unexamined Patent Application Publication No. 2011-3800
PTL 3: Japanese Unexamined Patent Application Publication No. 2008-141154
PTL 4: Japanese Unexamined Patent Application Publication No. 2011-35219

SUMMARY OF INVENTION

It is an object of the present invention to suppress mountain-like thermal distortion of a heat sink, suppress peeling of a member to be bonded and, in addition, suppress reduction in the thermal diffusibility of the heat sink.

A heat sink according to an aspect of the present invention has one surface bonded to a member to be bonded and the other surface in contact with a cooling member, and the heat sink is provided with a metal plate having a thermal expansion coefficient larger than that of the above-described member to be bonded, wherein the above-described metal plate is provided with a center portion where the above-described member to be bonded is bonded and a plurality of linear radial slits formed in a whirl-like radial manner and in such a way as to surround the above-described center portion.

DESCRIPTION OF EMBODIMENTS

First Embodiment

Figure 1:
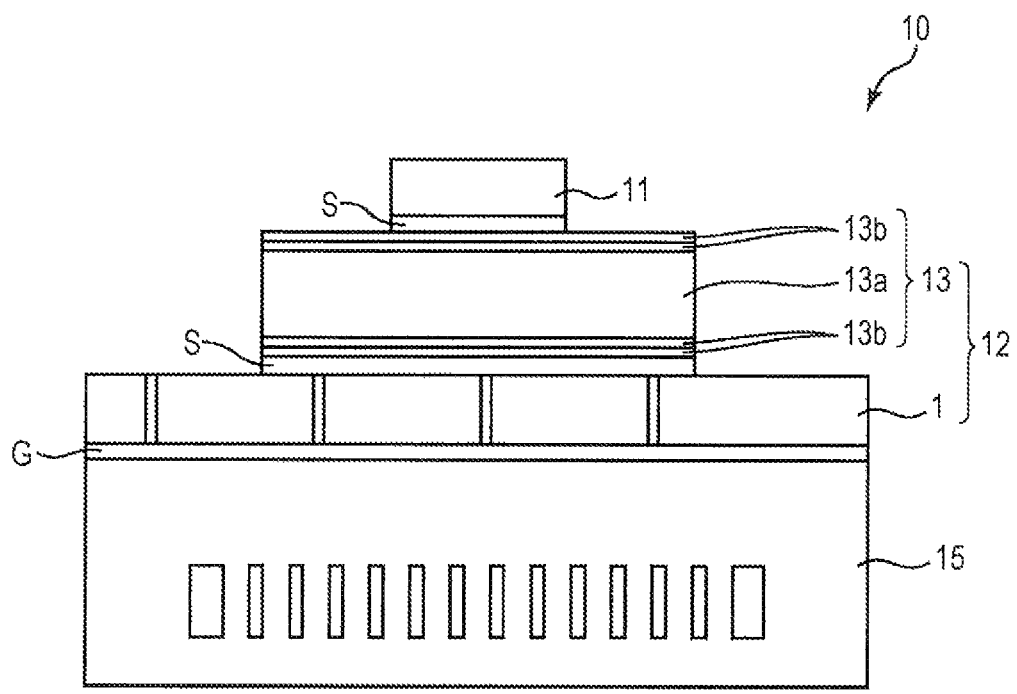
FIG. 1 is a sectional view of an electronic part apparatus provided with a metal heat sink 1 according to a first embodiment.

A metal heat sink 1 (heat sink) according to a first embodiment of the present invention will be described with reference to FIG. 1 to FIG. 4. In this regard, for the sake of brevity, in FIG. 2 and FIG. 4, as for a plurality of peripheral slits 26, a plurality of portions, e.g., outside end portions 26o, of the plurality of peripheral slits 26, and a plurality of portions, e.g., a plurality of triangular portions 27, surrounded by the plurality of peripheral slits 26, only part of them are indicated by reference numerals. The metal heat sink 1 is used as part of an electronic part apparatus 10 shown in FIG. 1.

(Electronic Part Apparatus 10)

The electronic part apparatus 10 is provided with an electronic part 11 (member to be bonded) serving as a heat source (object of heat dissipation), a composite heat sink 12 connected to the electronic part 11, and a heat sink 15 (cooling member) attached to the composite heat sink 12. In this regard, the electronic part apparatus 10 may be further provided with members for heat dissipation other than these members. The composite heat sink 12 is provided with an insulating heat sink 13 (member to be bonded) attached to the electronic part 11 and a metal heat sink 1 attached to the insulating heat sink 13 and the heat sink 15. The electronic part apparatus 10 is configured in such a way that the temperature decreases from the electronic part 11 side (upper side in FIG. 1) toward the heat sink 15 side (lower side in FIG. 1). The electronic part apparatus 10 is configured to suppress a distortion due to a difference in the thermal expansion coefficient. In the electronic part apparatus 10, the thermal expansion coefficient increases in the order of the electronic part 11, the insulating heat sink 13, the metal heat sink 1, and the heat sink 15, that is, in the order from top to bottom in FIG. 1.

The electronic part 11 (member to be bonded) is a semiconductor element and is a part used for a hybrid car, an electric car, and the like. This semiconductor element is, for example, a LED (Light-emitting diode) and a semiconductor element for electric power (power device). Examples of semiconductor elements for electric power include rectifier diodes and power transistors. Examples of power transistors include IGBT (Insulated Gate Bipolar Transistor), Power MOS FET (Power Metal-Oxide-Semiconductor Field-Effect Transistor), and thyristors, e.g., gate turn-off thyristors and TRIACs.

In some cases, this electronic part 11 repeats high density heat generation, specifically sharp increase in temperature and decrease in temperature. In the case where the electronic part 11 is a power transistor, for example, several hundreds of volts (600 V or the like) of voltage is applied between electrodes of the electronic part 11. In the case where the electronic part 11 is a power transistor used for a hybrid car or an electric car, a large current passes the electronic part 11 at the start of passing of the current, in particular, when the car is allowed to start or begin to run and the like.

This electronic part 11 has a thermal expansion coefficient smaller than that of a metal plate 20 described later, which is part of the metal heat sink 1. Examples of materials for the electronic part 11 include Si (silicon), SiC (silicon carbide), GaN (gallium nitride), Ge (germanium), and GaAs (gallium arsenide). In this regard, a buffer to store heat may be attached to the surface (upper surface in FIG. 1) on the side reverse to the surface to be bonded to the composite heat sink 12 in the electronic part 11. As for the buffer, a member having a large heat capacity may be used.

The composite heat sink 12 is a member to perform heat dissipation of the electronic part 11. As described above, the composite heat sink 12 is provided with the insulating heat sink 13 and the metal heat sink 1.

The insulating heat sink 13 (member to be bonded) is an insulating member to prevent electrical leakage from the electronic part 11 and, specifically, is a member to insulate the metal heat sink 1 and the heat sink 15 from the electronic part 11. The insulating heat sink 13 dissipates the heat conducted from the electronic part 11 and, in addition, conducts the heat conducted from the electronic part 11 to the metal heat sink 1. The insulating heat sink 13 is bonded to the electronic part 11 through the solder S. The insulating heat sink 13 has a surface area larger than that of the electronic part 11. The insulating heat sink 13 is tabular. In this regard, the insulating heat sink 13 may have the shape of a film. The thickness of the insulating heat sink 13 is, for example, 10 μm to 3 mm. The thermal expansion coefficient of the insulating heat sink 13 is smaller than the thermal expansion coefficient of the metal plate 20 described later and is larger than the thermal expansion coefficient of the electronic part 11.

The insulating heat sink 13 is, for example, a DBA (Direct Brazed Aluminum) substrate. For further details, the insulating heat sink 13 is formed from two types of layers 13a and 13b. The layer 13a is made from AlN (aluminum nitride, thermal conductivity: 150 W/(m·K), thermal expansion coefficient: 4.7×10$^{-6}$ [1/K]), which is an insulator, or a material containing AlN and a small amount of impurities. The layer 13b is disposed on each of the surface and the back of the layer 13a and is formed from Al (aluminum). The layer 13b of Al disposed on the surface of the layer 13a is to bond the electronic part 11 to the insulating heat sink 13 with the solder S, and the layer 13b disposed on the back of the layer 13a is to bond the metal heat sink 1 to the insulating heat sink 13 with the solder S. The layers 13b made from Al is formed on the surface and the back of the layer 13a made from AlN by, for example, plating Al through evaporation or the like. In this regard, the layer 13b made from Al is sufficiently thinner than the layer 13a made from AlN and, therefore, hardly contributes to thermal distortion of the composite heat sink 12.

The layer 13a of the insulating heat sink 13 may be made from, for example, diamond (thermal conductivity: 500 to 1,000 W/(m·K) thermal expansion coefficient: 2.2×10$^{-6}$ [1/K]) or a material containing diamond and a small amount of impurities. Meanwhile, the layer 13a of an insulator may be formed from a plurality of layers, and those plurality of layers my be made from different types of materials. The insulating heat sink 13 may be a printed circuit board (may be referred to as printed wiring board) which is a substrate provided with an electric wire pattern on the surface. The insulating heat sink 13 may be a tabular member separate from a metal heat sink 1 described later or may be a thin film layer formed on the surface of the metal heat sink 1 through evaporation. In the case where the insulating heat sink 13 is formed through evaporation, for example, PVD (Physical Vapor Deposition) or CVD (Chemical Vapor Deposition) can be used. Examples of the CVD include microwave plasma CVD and hot-filament CVD.

The heat sink 15 (cooling member) is a member to cool the heat conducted from the metal heat sink 1 to the heat sink 15. For example, a plurality of holes and fins are disposed in the inside of the heat sink 15, and the heat conducted from the metal heat sink 1 to the heat sink 15 concerned is cooled by cooling water passing the inside thereof. The temperature of the cooling water is kept at, for example, 65° C. The heat sink 15 is made from, for example, Al. The heat sink 15 has a thickness larger than the thickness of the metal heat sink 1 (described later) in order that sufficient rigidity is obtained even when a plurality of holes and fins are disposed in the inside. The plate surface of the heat sink 15 has substantially the same size as that of the metal heat sink 1. In this regard, the plate surface of the heat sink 15 may be larger than the metal heat sink 1. Meanwhile, the thermal expansion coefficient of the heat sink 15 is larger than the thermal expansion coefficient of the metal plate 20 (described later) of the metal heat sink 1. In this regard, the thermal expansion coefficient of the heat sink 15 may be substantially the same as the thermal expansion coefficient of the metal plate 20 (described later). The surface of the metal heat sink 1 opposite to the surface where the metal plate 20 (described later) is bonded to the insulating heat sink 13 is in contact with the heat sink 15 with grease G therebetween. Here, the term "contact" refers to both concepts of direct contact of the metal heat sink 1 and the heat sink 15 and contact of the two with, for example, grease therebetween.

(Metal Heat Sink 1)

Figure 2:
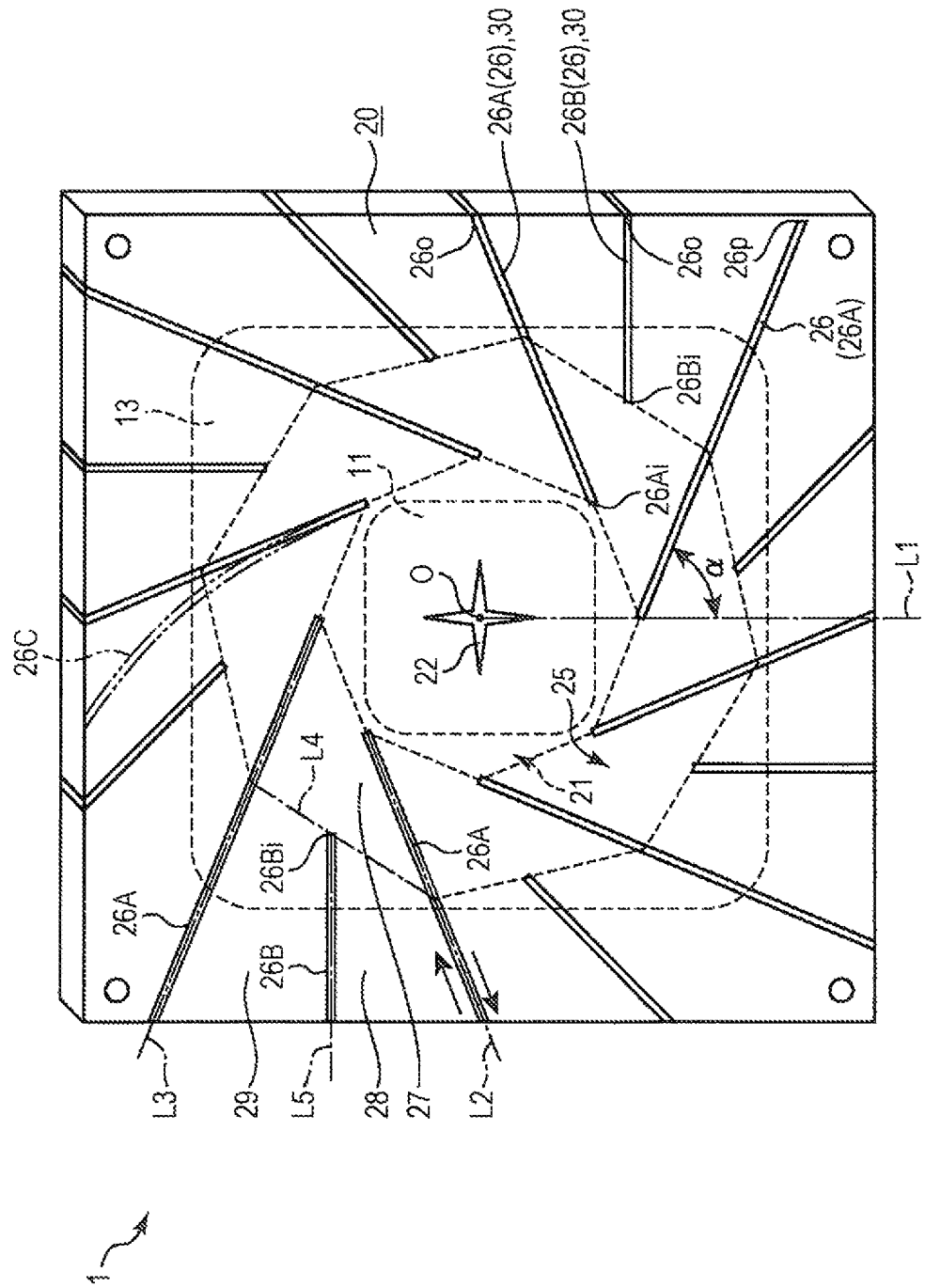
FIG. 2 is a perspective view of the metal heat sink 1 shown in FIG. 1.

The metal heat sink 1 (heat sink) is a member to diffuse and dissipate the heat conducted from the electronic part 11. In the case where the heat from the electronic part 11 is dissipated, the metal heat sink 1 conducts the heat to the heat sink 15. The metal heat sink 1 is bonded to the electronic part 11 with the insulating heat sink 13 therebetween. In this regard, the metal heat sink 1 may be directly connected to the electronic part 11. Here, the term "bond" refers to join the two while the thermal conductivity between the two is maintained. This concept "bond" includes diffusion bonding, soldering or brazing, and the like. As shown in FIG. 2, the metal heat sink 1 is tabular and, for example, is tetragonal in a plan view. In this regard, the metal heat sink 1 may be circular in a plan view or may have another shape. Here, the term "in a plan view" refers to "when viewed from the thickness direction of the metal heat sink 1", and the same goes for the term "in a plan view" described hereafter. The thickness of the metal heat sink 1 is, for example, 100 μm to 5 mm, and desirably 100 μm to 3 mm. The plate surface of the metal heat sink 1 is larger than the plate surface of the insulating heat sink 13. In this regard, the plate surface of the metal heat sink 1 may be the same size as that of the plate surface of the insulating heat sink 13. The metal heat sink 1 is provided with the metal plate 20 constituting most part of the metal heat sink 1 concerned and a buried metal 30 buried in the metal plate 20.

The metal plate 20 is a plate provided with a plurality of peripheral slits 26. The metal plate 20 has a large thermal expansion coefficient. Specifically, the metal plate 20 has a thermal expansion coefficient larger than the thermal expansion coefficients of the electronic part 11 and the insulating heat sink 13. In addition, the metal plate 20 has a high thermal conductivity. Specifically, the metal plate 20 has a thermal conductivity larger than the thermal conductivities of the electronic part 11 and the insulating heat sink 13. The material for forming the metal plate 20 is desirably a material having relatively high thermal conductivity. Specifically, it is desirable that the material has a thermal conductivity of 100 W/(m·K) or more at room temperature (20° C.). The material for forming the metal plate 20 may be either a single material or an alloy. The metal plate 20 is made from any one of, for example, Al, Au (gold), Ag (silver), Cu (copper), Mg (magnesium), W (tungsten), Mo (molybdenum), and Zn (zinc), or an alloy of at least two types of metals selected from them. It is desirable that the metal plate 20 be made from pure Cu, pure Al, or an alloy thereof. The purity of pure Cu (thermal conductivity: 386 W/(m·K), thermal expansion coefficient: 16.5×10$^{-6}$ [1/K]) is 99 percent by weight or more. The purity of pure Al (thermal conductivity: 204 W/(m·K), thermal expansion coefficient: 23.9×10$^{-6}$ [1/K]) is 99 percent by weight or more. The metal plate 20 includes a center portion 21 located at the center of the metal heat sink 1 in a plan view and a peripheral portion 25 located on the side outer than the center portion 21 in a plan view.

The center portion 21 is a region located on the side inner than the peripheral slit 26 in the metal plate 20 in a plan view of the metal plate 20. For details, the center portion 21 is a region located on the side inner than the inside end portion 26Ai of the slit 26A described later. The center portion 21 is formed having a planar shape, put another way, a flat shape. The center portion 21 has the shape of, for example, a regular polygon, e.g., a regular octagon, other polygon, or a circle (not shown in the drawing). FIG. 2 shows an example in which the center portion 21 is formed having the shape of a regular octagon. The electronic part 11 is bonded to the center portion 21 with the insulating heat sink 13 therebetween. In this regard, the electronic part 11 may be directly bonded to the center portion 21. For example, the electronic part 11 may be allowed to adhere or be glued to the center portion 21. The electronic part 11 generates heat at a high density, and the heat from the electronic part 11 is conducted to the center portion 21 easily as compared with the peripheral portion 25. It is desirable that the area of the center portion 21 be larger than the area of a main heat-generating region of the electronic part 11. In this regard, in the electronic part 11, a region located at an outer edge of the main heat-generating region, that is, the region generating heat smaller than that of the main heat-generating region and the peripheral slit 26 may overlap one another in a plan view. Meanwhile, the peripheral region of the electronic part 11 overlapping the peripheral slit 26 is not necessarily bonded to the peripheral portion 25 directly or with the insulating heat sink 13 therebetween.

In addition, a center slit 22 may be disposed in the center portion 21. A plurality of center slits 22 are disposed in the center portion 21. Each center slit 22 is formed having a linear shape. The plurality of center slits 22 intersect at the center O of the center portion 21 in a plan view. In this regard, the center O at which the plurality of center slits 22 intersect may not be the center of the center portion 21 strictly. The plurality of center slits 22 are formed having the shape of, for example, a cross (shape of the symbol "+") intersecting at the center O. Alternatively, the plurality of center slits 22 may be formed from three center slits 22 and be formed having the shape of the letter Y, where the three center slits 22 intersect at the center O. Also, the plurality of center slits 22 may be formed from three center slits 22 and be formed having the shape of the symbol "*", where the three center slits 22 intersect at the center O. Put another way, six center slits 22 may be formed having the shape of the symbol "*" while intersecting at the center O. The width of each center slit 22 in a plan view becomes, for example, larger with increasing proximity to the center O. It is preferable that the center slit 22 be hollow. In this regard, the center slits 22 are not necessarily hollow insofar as a function (described later) of suppressing the mountain-like thermal distortion of the center portion 21 can be realized. For example, a metal or the like, which is deformed more easily as compared with the metal constituting the metal plate 20, may be buried in the center slit 22.

The peripheral portion 25 is a portion located on the side outer than the center portion 21 in the metal plate 20 in a plan view. Put another way, the peripheral portion 25 is a portion located in the periphery of the center portion 21 of the metal plate 20. The metal plate 20 is formed into the shape of a flat plate as a whole. The insulating heat sink 13 is bonded to, for example, part of the peripheral portion 25. In this regard, the insulating heat sink 13 may not be bonded to the peripheral portion 25.

The plurality of peripheral slits 26 are a plurality of gaps disposed in the peripheral portion 25 in such a way as to surround the center portion 21. Each of the plurality of peripheral slits 26 is formed having a linear shape. Each peripheral slit 26 is a groove with no bottom, which is formed while penetrating the metal heat sink 1 in the depth direction. The plurality of peripheral slits 26 include, for example, two types of slits 26A and 26B (described later in detail). In this regard, the plurality of peripheral slits 26 may be formed from only one type of slit, or be formed from at least three types of slits. The shapes taken by the peripheral slit 26 in a plan view of the metal heat sink 1 will be further described below.

The plurality of peripheral slits 26 extend in such a way as to surround the center portion 21 and connect the perimeter portion of the center portion 21 and the perimeter portion of the metal heat sink 1. In this regard, an outer end portion 26o, which is one end portion located to the outer side of the metal heat sink 1 in a plan view of the metal heat sink 1, of two end portions of the peripheral slit 26 may not reach the perimeter portion of the metal heat sink 1. Specifically, in the same manner as an outer end portion 26p of a slit 26A at the lower right in FIG. 2, the end portion may be stopped inside the perimeter portion of the metal heat sink 1. However, it is preferable that the distance between this outer end portion 26p and the perimeter portion of the metal heat sink 1, that is, the thickness of the portion between the outer end portion 26p and the perimeter portion of the metal heat sink 1 opposing to the outer end portion 26p in the metal heat sink 1 be a dimension which does not hinder shear deformation of portions, described later, located at both sides of the peripheral slit 26. The appropriate thickness of the portion between the outer end portion 26p and the perimeter portion of the metal heat sink 1 is determined in accordance with the type of the material constituting the buried metal.

The plurality of peripheral slits 26 are formed in a whirl-like radial manner. Put another way, the plurality of peripheral slits 26 are formed having a spiral shape or a pinwheel-like shape. The whirl-like radial manner refers to the shape in which a plurality of radial straight lines are inclined or bended clockwise or counterclockwise. For further details, the peripheral slits 26 are disposed while being inclined with respect to a straight line L1 described below. That is, an angle α descried below is larger than 0° and smaller than 90°. The straight line L1 is a straight line passing through the center O of the center portion 21 and extending along the primary surface of the metal plate 20 and passes through at least part of the peripheral slit 26. The angle α is an angle formed by the peripheral slit 26 and the straight line L1 at the intersection of the peripheral slit 26 and the straight line L1. In this regard, the peripheral slit 26 may partly has a portion not inclined with respect to the straight line L1, that is, a portion overlapping along the straight line L1. However, the case where each peripheral slit 26 overlaps the straight line L1 as a whole is not corresponds to "whirl-like radial manner". Therefore, extensions of the individual peripheral slits 26 deviate from the center O to one side (left side in FIG. 2).

The peripheral slit 26 is formed having a linear shape. The peripheral slit 26 may have the shape of a straight line or the shape of a curve (refer to slit 26C). In the case where the peripheral slit 26 has the shape of a curve, the peripheral slit 26 is formed having, for example, the shape of a curve with a constant curvature or, for example, the shape of a curve with a continuously varying curvature. Examples of the shapes of curves with a continuously varying curvature include the shape of a curve with a curvature gradually increasing from the inner side toward the outer side of the metal heat sink 1 in a plan view. In this regard, specific shapes of the metal heat sink provided with peripheral slits 26 having a curved shape will be described in modified examples of a fourth embodiment in detail. The plurality of peripheral slits 26 are formed in such a way as not to intersect. The width of the peripheral slit 26 is a width which facilitates shear deformation, described later, of both side portions of the peripheral slit 26 in the metal plate 20 and plastic deformation of the buried metal 30. Also, an appropriate width of the peripheral slit 26 depends on the amount of thermal distortion of the metal heat sink 1 and the strain-stress characteristic of the buried metal 30. The width of the peripheral slit 26 is, for example, several hundreds of micrometers or more and 1 mm or less.

The slit 26A extends from the perimeter of the center portion 21 in a plan view to the perimeter of the metal heat sink 1 in a plan view. For example, in the case where the center portion 21 is octagonal, the slit 26A is disposed on an extension of each side of this octagon. That is, eight slits 26A in total are disposed in the metal heat sink 1.

The slit 26B is disposed between adjacent two slits 26A, for example, at the center position between the two slits 26A. In the case where eight slits 26A are disposed, eight slits 26B are also disposed. Inner end portions 26Bi, in a plan view, of the slits 26B are arranged outer, in the plan view, than the inner end portions, in the plan view, of the slits 26A.

Here, the peripheral portion 25 can be divided into, for example, eight triangular portions 27, eight tetragonal portions 28, and eight tetragonal portions 29. In this regard, the triangular portion 27 is a portion surrounded by a straight line L2, a straight line L3, and a straight line L4. The tetragonal portion 28 is a portion surrounded by the straight line L2, the straight line L4, a straight line L5, and the perimeter of the metal heat sink 1. The tetragonal portion 29 is a portion surrounded by the straight line L3, the straight line L4, the straight line L5, and the perimeter of the metal heat sink 1. The straight line L2 and the straight line L3 are two straight lines passing on the two adjacent slits 26A in the plan view. The straight line L4 is a straight line passing through the inner end portion 26Bi of the slit 26B located between these adjacent two slits 26A and points on these two slits 26A. The straight line L4 passes through, for example, points in the vicinity of the centers in the length directions of adjacent two slits 26A. The straight line L5 is a straight line passing on the slit 26B.

The buried metal 30 is buried in the peripheral slits 26 in the metal plate 20. The buried metal 30 is disposed in such a way as to fill the whole peripheral slit 26. That is, the shape of the buried metal 30 and the inside shape of the peripheral slit 26 are the same. The buried metal 30 is plastically deformed by the shearing stress along the peripheral slit 26 (refer to two arrows on both sides of the straight line L2 shown in FIG. 2) easily as compared with the metal plate 20. The buried metal 30 is not elastically deformed by the shearing stress along the peripheral slit 26 easily as compared with the metal plate 20. The material for forming the buried metal 30 is specified to be a metal different from the material constituting the metal plate 20. As for the material for forming the buried metal 30, a material, which does not react with the material constituting the metal plate 20 to generate a compound in the extrusion step described later, is selected. The material for forming the buried metal 30 may be either a single material or an alloy. Specifically, the buried metal 30 is made from various materials as described in, for example, the items (i) to (iii) below.

(i) The buried metal 30 is made from Sn (tin), Pb (lead), Ag, Bi (bismuth), Zn, Al, or an alloy of at least two types of metals selected from them.

(ii) The buried metal 30 is made from pure Nb (niobium) or pure Ta (tantalum). In this case, the purity of pure Nb is 98 percent by weight or more, and preferably 99 percent by weight or more. Also, the purity of pure Ta is 98 percent by weight or more, and preferably 99 percent by weight or more. Meanwhile, Nb and Ta become hard when being mixed with other materials, and extrusion and plastic deformation described later become difficult. Therefore, in the case where the buried metal 30 is made from pure Nb or pure Ta, the buried metal 30 is made from not an alloy but a single material of pure Nb or pure Ta.

(iii) The buried metal 30 is made from a Zn—Al alloy or a Zn—Al based superplastic metal.

(Manufacturing Method)

Next, a method for manufacturing the metal heat sink 1 will be described. The method for manufacturing the heat sink 1 includes an assembling step to assemble a composite columnar member 40 shown in FIG. 4, an extrusion step to extrude and contract the composite columnar member 40, a size-finishing step to finish the cross-sectional size of an extruded member 60 including the composite columnar member 40 contracted in the extrusion step, and a slice step to slice the extruded member 60 after the size-finishing step.

Figure 4:
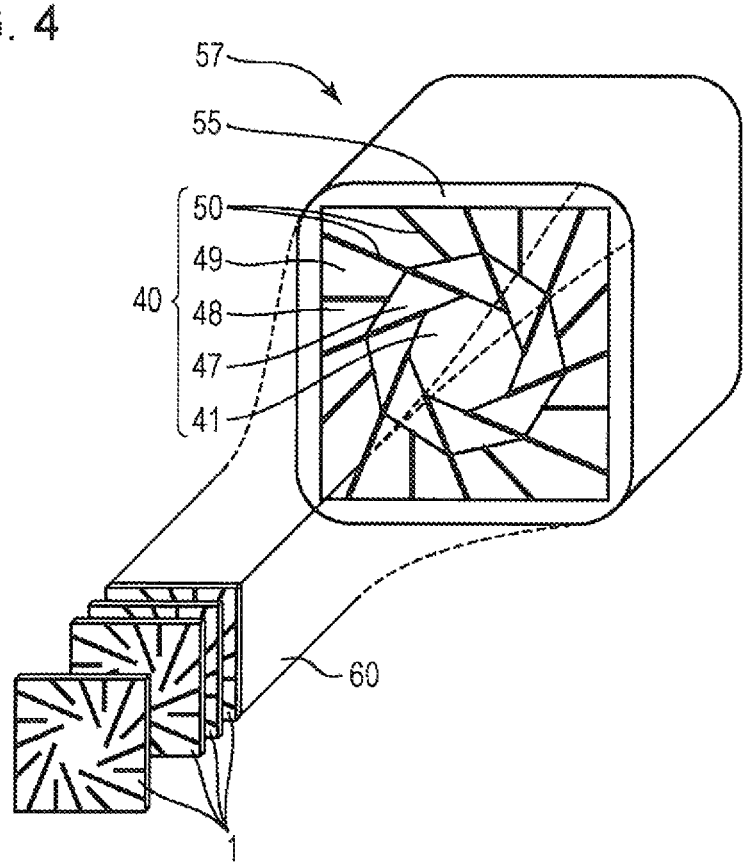
FIG. 4 is a perspective view of an extrusion burette 57 and the like shown in FIG. 3.

The assembling step is a step to assemble an integrated composite columnar member 40 by allowing columnar members 41, 47, 48, and 49 made from a material for forming the metal plate 20 (refer to FIG. 2) to adhere to a tabular member 50 made from a material for forming the buried metal 30 (refer to FIG. 2). Assembling of the composite columnar member 40 in the assembling step is performed in such a way that the structure in a plan view and a cross-sectional structure of the metal heat sink 1 (refer to FIG. 2) become the same structure as the cross-sectional structure of the composite columnar member 40 viewed from the axial direction. In this regard, there may be differences, e.g., presence or absence of slight gaps, between those structures. For further details, in the assembling step, the columnar members 41, 47, 48, and 49 and a tabular member 50 shown in FIG. 4, which have cross sections similar to, for example, the center portion 21, the triangular portion 27, the tetragonal portion 28, the tetragonal portion 29, and the buried metal 30 (or peripheral slit 26), respectively, of the octagon shown in FIG. 2 are prepared. Subsequently, as shown in FIG. 4, the integrated composite columnar member 40 is assembled by allowing the columnar members 41, 47, 48, and 49 and the tabular member 50 to adhere. Thereafter, the composite columnar member 40 is fit into the inside of a tubular member 55. Then, an extrusion burette 57 is formed by sealing both ends in the axial direction of the tubular member 55, into which the composite columnar member 40 has been fitted, by welding. For example, electron beam welding in a vacuum is employed for the welding at this time. Meanwhile, the tubular member 55 is made from, for example, the material for forming the metal plate 20.

The extrusion step is a step to contract the extrusion burette 57 including the composite columnar member 40 by hydrostatic extrusion (isotropic pressure extrusion) in a direction orthogonal to the axial direction of the composite columnar member 40 concerned. The extrusion step is performed using a hydrostatic extrusion apparatus 100 shown in FIG. 3. In the hydrostatic extrusion apparatus 100, the extrusion burette 57 is disposed in the inside of a space surrounded by a container 101, a seal piston 102, and a dice 103 while a liquid pressure medium 104 is interposed around the extrusion burette 57. Subsequently, when a stem 105 is pressed in, the extruded member 60 formed by contracting the extrusion burette 57 in such a way as to become small in equal ratio in accordance with the shape of the dice 103 is extruded from the hydrostatic extrusion apparatus 100. In the extrusion step, the extrusion burette 57 including the composite columnar member 40 before extrusion shown in FIG. 4 is heated to a predetermined extrusion temperature and is extruded. The cross-sectional structure of the composite columnar member 40 before extrusion is maintained in the cross-sectional structure of the extruded member 60 including the composite columnar member 40 after extrusion. In the composite columnar member 40 after the extrusion, the individual columnar members 41, 47, 48, and 49 and the tabular member 50 are diffusion bonded to each other.

The size-finishing step is a step to finish the extruded member 60 in such a way as to have a predetermined cross-sectional size. In the size-finishing step, the perimeter portion of the extruded member 60, that is, the portion corresponding to the tubular member 55 is removed. The processing to remove the perimeter of the extruded member 60 is executed by, for example, cutting, e.g., lathe machining and milling, and stamping with a punch. In this regard, the size-finishing step may be performed after a slice step described below. Alternatively, the size-finishing step may not be performed.

The slice step is a step to slice the extruded member 60 including the composite columnar member 40, which has been contracted in the extrusion step, along the surface orthogonal to the axial direction thereof. The extruded member 60 is sliced in this slice step and, thereby, the metal heat sink 1 is obtained.

Meanwhile, in the case where the center slits 22 are disposed in the center portion 21 of the metal heat sink 1 shown in FIG. 2, the center slits 22 are formed as described below. In the case where hollow center slits 22 are disposed, the metal heat sink 1 before formation of the center slits 22 is subjected to, for example, stamping with a punch and, thereby, the center slits 22 are formed. Meanwhile, in the case where a metal or the like is buried in the center slits 22, in the above-described assembling step, columnar members (not shown in the drawing) having cross sections similar to the center slits 22 are fit into the columnar members 41 (refer to FIG. 4) corresponding to the center portion 21. The center slits 22 with buried metal or the like are formed through this step. Alternatively, hollow center slits 22 may be formed by the same method as the method for forming hollow peripheral slits 26 in a third embodiment (refer to FIG. 10) described later, that is, a method for manufacturing the metal heat sink 1, including the elution step.

(Deformation by Heat)

When the electronic part 11 shown in FIG. 1 generates heat at a high density, the heat is conducted to the metal heat sink 1 through the insulating heat sink 13. At this time, in the metal heat sink 1, an occurrence of the mountain-like thermal distortion is suppressed and, in addition, the heat is diffused to the outer side of the metal heat sink 1 in a plan view.

(Mountain-Like Thermal Distortion)

Figure 20:
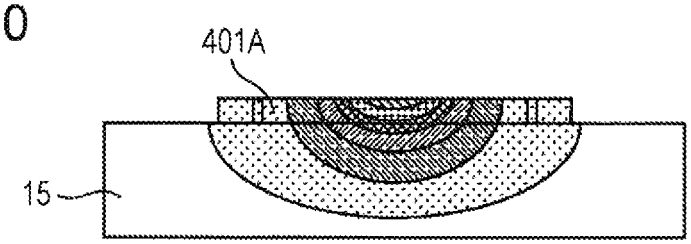
FIG. 20 is a vertical sectional view of a metal heat sink and a heat sink showing the thermal stress analysis results of an analysis model according to an example.

The thermal expansion coefficient of the insulating heat sink 13 bonded to the metal heat sink 1 is smaller than the thermal expansion coefficient of the metal plate 20 of the metal heat sink 1 (refer to FIG. 20). Consequently, not only the portion around the center portion 21 located in the vicinity of the electronic part 11 in the metal heat sink 1 shown in FIG. 2 but also the whole metal heat sink 1 tends to be deformed in the thickness direction thereof. That is, the mountain-like thermal distortion, which is warp deformation, tends to occur in the metal heat sink 1. In this regard, the thickness of the metal heat sink 1 is, for example, 100 μm to 5 mm, as described above, so that differences in thermal expansion coefficients in the thickness direction between the individual portions of the metal heat sink 1 hardly contributes to thermal distortion of the metal heat sink 1.

(Suppression of Mountain-Like Thermal Distortion)

The buried metal 30 of the metal heat sink 1 is plastically deformed by the shearing stress along the peripheral slit 26 easily as compared with the metal plate 20. Therefore, the metal heat sink 1 is deformed by thermal strain as described in the items (i) and (ii) below.

(i) The center portion 21 is led to rotational deformation centering the center O in a plan view. In the case of the configuration shown in FIG. 2, the center portion 21 is led to counterclockwise rotational deformation.

(ii) The peripheral portion 25 expands outward substantially along the individual peripheral slits 26 in a whirl-like radial manner in a plan view. At this time, in the peripheral portion 25, each portion sandwiched between two adjacent peripheral slits 26 expands toward a direction slightly different from the direction of the adjacent portion. That is, in the metal plate 20, portions located on both sides of the peripheral slit 26, while sandwiching the peripheral slit 26, in a plan view, are shear-deformed (refer to arrows on both sides of straight line L2).

The metal heat sink 1 is deformed as described in the items (i) and (ii). Therefore, the mountain-like thermal distortion, which is deformation in the thickness direction of the metal heat sink 1, is dispersed in the plate surface direction. Put another way, the deformation in the thickness direction of this metal heat sink 1 is converted to deformation in the direction orthogonal to the thickness direction of the metal heat sink 1. Meanwhile, in the case where the electronic part 11 is cooled and the metal heat sink 1 is cooled along with that, the metal heat sink 1 is deformed in the direction reverse to the above-described direction.

(Thermal Diffusion)

When the electronic part 11 generates heat at a high density, the heat is conducted to the center portion 21 of the metal heat sink 1. This heat diffuses from the inner side to the outer side of the metal heat sink 1, in a plan view, in the direction from the center portion 21 toward the peripheral portion 25. Here, the peripheral slits 26 and the buried metals 30 are formed in a whirl-like radial manner and, therefore, the above-described thermal diffusion of the metal heat sink 1 is performed easily as compared with the case where peripheral slits are formed along the circumference centering the center O.

Advantage 1

Next, advantages by the metal heat sink 1 will be described. As shown in FIG. 1, the metal heat sink 1 is a heat sink having one surface bonded to the insulating heat sink 13 (member to be bonded) and the other surface in contact with the heat sink (cooling member). As shown in FIG. 2, the metal heat sink 1 is provided with the metal plate 20 having a thermal expansion coefficient larger than that of the insulating heat sink 13 and the buried metal 30 buried in the metal plate 20. The metal plate 20 is provided with the center portion 21 where the insulating heat sink 13 is bonded and the plurality of linear peripheral slits 26 formed in a whirl-like radial manner and in such a way as to surround the center portion 21. The buried metal 30 is buried in the peripheral slits 26 and is plastically deformed by the shearing stress along the peripheral slit 26 easily as compared with the metal plate 20. Meanwhile, the electronic part 11 (member to be bonded) may be directly bonded to the center portion 21 of the metal heat sink 1, and the electronic part apparatus 10 may be bonded with the insulating heat sink 13 therebetween.

Advantage 1-1

The plurality of linear peripheral slits 26 are formed in a whirl-like radial manner and in such a way as to surround the center portion 21. The buried metal 30 is buried in the peripheral slit 26. The buried metal 30 is plastically deformed by the shearing stress along the peripheral slit 26 easily as compared with the metal plate 20. According to this configuration, when the metal heat sink 1 is going to be distorted into the mountain-like shape in the thickness direction because of a differences in thermal expansion coefficients between the insulating heat sink 13 or the electronic part 11 and the metal plate 20, portions located on both sides of the peripheral slit 26, while sandwiching the peripheral slit 26, in a plan view, in the metal heat sink 1 are shear-deformed along the peripheral slit 26. Therefore, deformation in the thickness direction of the metal heat sink 1 is dispersed in the plate surface direction orthogonal to the thickness direction of the metal heat sink 1 and is converted to deformation in the plate surface direction. Consequently, the mountain-like thermal distortion of the metal heat sink 1 can be suppressed. Then, peeling between the metal heat sink 1 and the insulating heat sink 13 or the electronic part 11 can be suppressed because the mountain-like thermal distortion can be suppressed.

In this regard, the mountain-like thermal distortion of the metal heat sink 1 can be suppressed by the above-described action and, therefore, in contrast to the technology described in PTL 4 above, it is not necessary to generate bellows crease deformation in the metal heat sink 1. Consequently, peeling between the metal heat sink 1 and the insulating heat sink 13 or the electronic part 11 resulting from this bellows crease deformation can be suppressed.

Advantage 1-2

The plurality of linear peripheral slits 26 are formed in a whirl-like radial manner and in such a way as to surround the center portion 21. Therefore, hindrance to thermal diffusion from the center to the outer side of the metal heat sink 1, in a plan view, put another way, thermal diffusion from the center portion 21 to the peripheral portion 25 by the peripheral slits 26 and the buried metals 30 can be suppressed. Consequently, degradation in the thermal diffusibility of the metal heat sink 1 can be suppressed. That is, degradation in the thermal diffusibility of the metal plate, which occurs because of formation of peripheral slits 26 in simple metal plates not provided with peripheral slits 26, can be suppressed.

Advantage 2

The metal plate 20 is provided with the plurality of linear center slits 22 formed in the center portion 21. The plurality of center slits 22 intersect at the center O of the center portion 21. Consequently, the peripheral region of the center slits 22 in the center portion 21 is deformed easily. Therefore, mountain-like thermal distortion in the center portion 21 can be suppressed.

This advantage will be further described. For example, in the case where the area of the electronic part 11 in itself is large and in the case where the area of a main heat generation region of the electronic part 11 is large, the area of the center portion 21 of the metal plate 20 may be increased. It is estimated that if the area of the center portion 21 is increased, mountain-like thermal distortion occurs in the center portion 21 easily for reasons of an increase in temperature difference in the region (in-plane) of the center portion 21 and the like. In the metal heat sink 1 provided with the above-described center slits 22, when a mountain-like thermal distortion is going to occur in the center portion 21, the peripheral region of the center slits 22 in the metal plate 20 is deformed and, thereby, the mountain-like thermal distortion can be absorbed. Consequently, the mountain-like thermal distortion in the center portion 21 can be suppressed.

Advantage 3

The metal plate 20 shown in FIG. 2 is made from pure Cu, pure Al, or an alloy thereof. Therefore, the thermal diffusibility of the metal plate 20 can be obtained reliably.

(Advantages 4 and 5)

The buried metal 30 is made from Sn, Pb, Ag, Bi, Zn, Al, an alloy of at least two types of metals selected from them, pure Nb, or pure Ta. Alternatively, the buried metal 30 is made from a Zn—Al alloy or a Zn—Al based superplastic metal. Therefore, the buried metal 30 is elastically deformed more easily.

Advantage 6

The metal heat sink 1 is produced by the manufacturing method including the assembling step, the extrusion step, and the slice step. As shown in FIG. 4, the assembling step is a step to assemble the integrated composite columnar member 40 by allowing the columnar members 41, 47, 48, and 49 made from a material for forming the metal plate 20 (refer to FIG. 2) to adhere to a tabular member 50 made from a material for forming the buried metal 30. The extrusion step is a step to contract the composite columnar member 40 by hydrostatic extrusion in a direction orthogonal to the axial direction of the composite columnar member 40 concerned. The slice step is a step to slice the composite columnar member 40 (extruded member 60), which has been contracted in the extrusion step, along the surface orthogonal to the axial direction thereof. The metal heat sink 1 can be produced by the above-described manufacturing method easily and, therefore, the metal heat sink 1 is mass-produced easily.

Meanwhile, the slits and the grooves described in PTLs 2 to 4 above (hereafter referred to as "groove and the like") are formed by processing, e.g., cutting and pressing, and the groove and the like have problems described in the following items (i) and (ii).

(i) It takes time and effort to form the grooves and the like by cutting the metal heat sink 1 one by one.

(ii) If the groove and the like are formed in the heat sink by pressing, grooves do not take on predetermined shapes easily, and it is difficult to process the grooves cleanly. Furthermore, if the grooves and the like are formed in the heat sink by pressing, there is a problem in that the heat sink is distorted into a corrugated shape. If the heat sink is distorted into a corrugated shape, for example, soldering becomes difficult.

Modified Example of First Embodiment

It is preferable that the extrusion temperature in the extrusion step is specified to be an appropriate temperature as described below in accordance with the type of a metal constituting the metal plate 20 and the buried metal 30.

Modified Example 1-1

Advantage 7

In Modified example 1-1, the metal plate 20 is made from pure Cu. The buried metal 30 is made from pure Nb or pure Ta. The extrusion temperature in the hydrostatic extrusion, that is the temperature in the hydrostatic extrusion of the extrusion burette 57 shown in FIG. 4 is a temperature within the temperature range of 600° C. to 900° C.

The hydrostatic extrusion is executed under this condition, so that the plurality of columnar members 41, 47, 48, and 49 shown in FIG. 4 are diffusion-bonded to each other. As a result, complete thermal contact between the plurality of columnar members 41, 47, 48, and 49 can be obtained. Consequently, the heat can be diffused reliably in the metal plate 20 shown in FIG. 2. In addition, the hydrostatic extrusion is executed under the above-described condition, so that the metal plate 20 and the buried metal 30 do not generate an intermetallic compound. Therefore, the buried metal 30 is elastically deformed more easily.

Modified Example 1-2

Advantage 8

In Modified example 1-2, the metal plate 20 is made from pure Al. The buried metal 30 is made from pure Ta. The extrusion temperature in the hydrostatic extrusion is a temperature within the temperature range of 200° C. to 600° C.

The hydrostatic extrusion is executed under this condition, so that the heat can be diffused reliably in the metal plate 20 and the buried metal 30 is elastically deformed more easily, as with Modified example 1-1 above.

Modified Example 1-3

Advantage 9

In Modified example 1-3, the metal plate 20 is made from pure Cu or pure Al. The buried metal 30 is made from Sn, Pb, Ag, Bi, Zn, Al, or an alloy of at least two types of metals selected from them. The extrusion temperature in the hydrostatic extrusion is 200° C. or lower which is the temperature range of cold hydrostatic extrusion.

The hydrostatic extrusion is executed under this condition, so that the metal plate 20 and the buried metal 30 do not generate an intermetallic compound. Therefore, the buried metal 30 is elastically deformed more easily.

Modified Example 1-4

Advantage 10

In the case where the extrusion temperature of the hydrostatic extrusion is 200° C. or lower, the assembling step is performed as described below. In the assembling step, foil is sandwiched between the plurality of the columnar members 41, 47, 48, and 49 (refer to FIG. 4) made from a material for forming the metal plate 20. The foil is made from Sn, Pb, Ag, Bi, Zn, Al, or an alloy of at least two types of metals selected from them and has a thickness of 50 μm or less.

In the case where the extrusion temperature is 200° C. or lower, the plurality of columnar members 41, 47, 48, and 49 cannot be diffuse-bonded on an as-is basis. Then, the foil serving as a buffer layer is sandwiched between the plurality of columnar members 41, 47, 48, and 49 and, thereby, complete thermal contact between the plurality of columnar members 41, 47, 48, and 49 can be obtained. As a result, the heat can be diffused reliably in the metal plate 20 (refer to FIG. 2).

Second Embodiment

Figure 5:
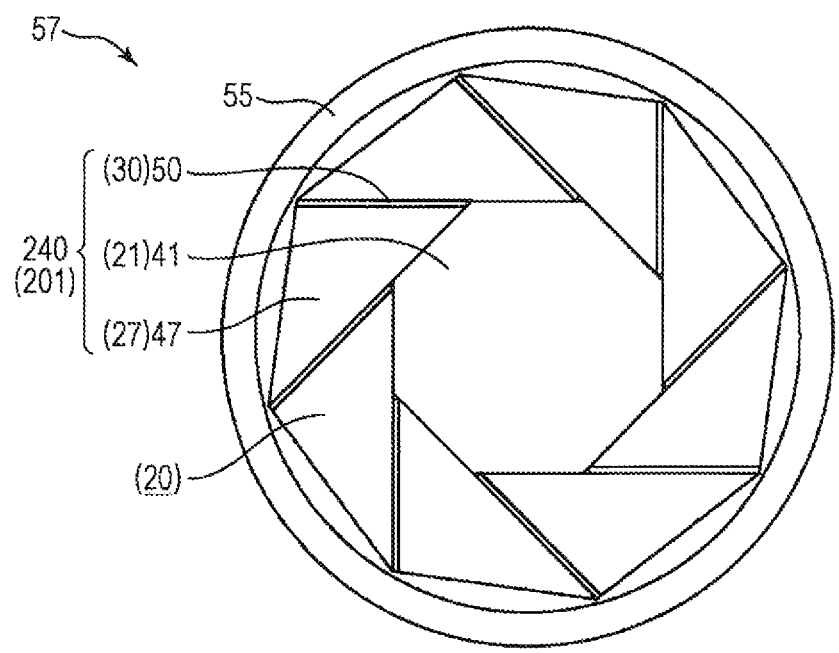
FIG. 5 is a plan view of a composite columnar member 240 and a tubular member 55 to form a metal heat sink 201 according to a second embodiment.
Figure 6:
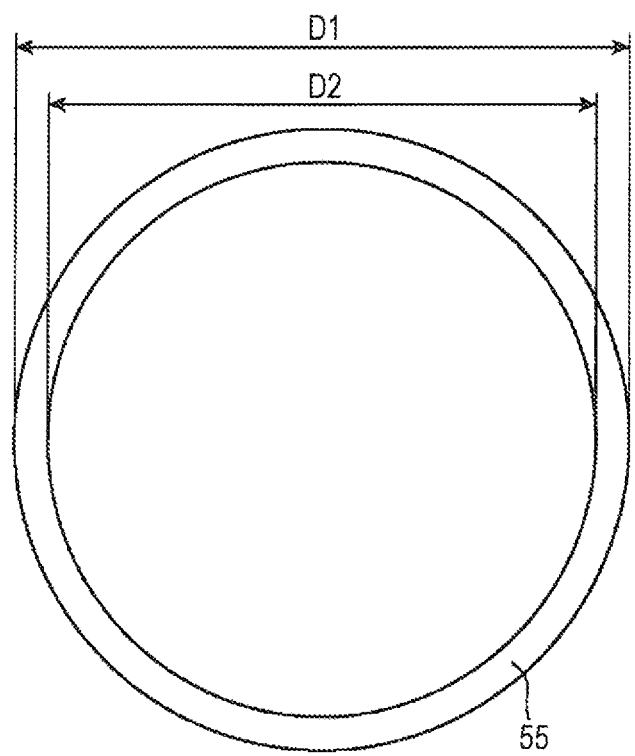
FIG. 6 is a plan view of the tubular member 55 shown in FIG. 5.
Figure 7:
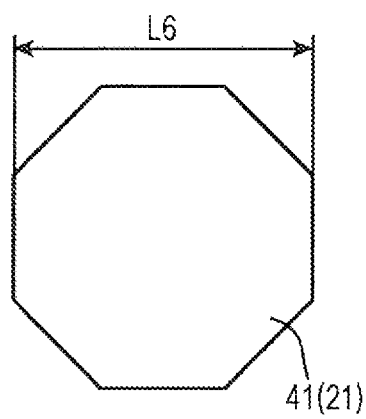
FIG. 7 is a plan view of a columnar member 41 in the composite columnar member 240 shown in FIG. 5.
Figure 8:
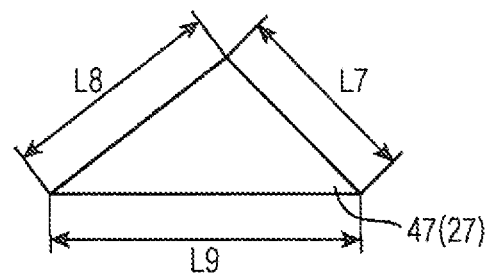
FIG. 8 is a plan view of a columnar member 47 in the composite columnar member 240 shown in FIG. 5.
Figure 9:
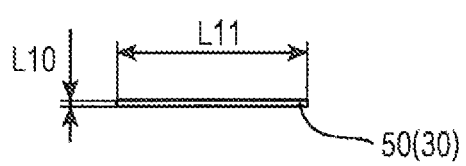
FIG. 9 is a plan view of a tabular member 50 in the composite columnar member 240 shown in FIG. 5.

As for a metal heat sink 201 in a second embodiment, points different from the first embodiment will be described with reference to FIG. 5 to FIG. 9. In this regard, FIG. 5 is a plan view of a composite columnar member 240 and a tubular member 55, viewed from the axial direction thereof. FIG. 6 is a plan view of the tubular member 55 viewed from the axial direction thereof. FIG. 7 is a plan view of a columnar member 41 viewed from the axial direction thereof. FIG. 8 is a plan view of a columnar member 47 viewed from the axial direction thereof. FIG. 9 is a plan view of a tabular member 50 viewed from the same direction. Meanwhile, in FIG. 5, FIG. 7, FIG. 8, and FIG. 9, reference numerals related to the composite columnar member 240 before extrusion are expressed with no parentheses and the reference numerals related to the metal heat sink 201 after extrusion, that is, after production, are expressed in parentheses.

As shown in FIG. 2, the metal heat sink 1 in the above-described first embodiment is a tetragonal in a plan view. In contrast to this, the metal heat sink 201 in the second embodiment is circular in a plan view (refer to FIG. 5). Also, the metal heat sink 201 is not provided with slits 26B (refer to FIG. 2). Also, a peripheral portion 25 of the metal heat sink 201 is not provided with the tetragonal portions 28 and 29 shown in FIG. 2. Next, a method for manufacturing the metal heat sink 201 will be described.

In the assembling step, the tubular member 55, the columnar member 41, a plurality of columnar members 47, and a plurality of tabular members 50, as shown in FIG. 6 to FIG. 9, are prepared. The tubular member 55 shown in FIG. 6 is formed having an outside diameter D1=68 mm and the inside diameter D2=61 mm and is a pure Cu pipe. The columnar member 41 (refer to FIG. 7) corresponding to the center portion 21 is formed having an opposite side length L6=30 mm and is a pure Cu octagonal rod. The columnar member 47 (refer to FIG. 8) corresponding to the triangular portion 27 has three sides L7, L8, and L9 and is a pure Cu triangular rod formed having a length of the side L7=19.2 mm, a length of the side L8=22.5 mm, and a length of the side L9=31.3 mm. The tabular member 50 (refer to FIG. 9) corresponding to the buried metal 30 is a pure Nb plate formed having a thickness L10=0.5 mm and a width L11=19 mm.

Also, in the assembling step, the composite columnar member 240 shown in FIG. 5 is assembled as described below. The columnar member 41 and eight columnar members 47 are incorporated into the tubular member 55, and those columnar member 41 and eight columnar members 47 are arranged in such a way that the sides L9 of the individual columnar members 47, which are triangular rods, come into contact with the respective sides of the columnar member 41, which is an octagonal rod (refer to FIG. 8). In the tubular member 55, the tabular members 50 are arranged on extensions of the individual sides of the columnar member 41. Subsequently, both ends in the axial direction of the tubular member 55 are sealed by welding. In this manner, the extrusion burette 57 is formed.

Figure 3:
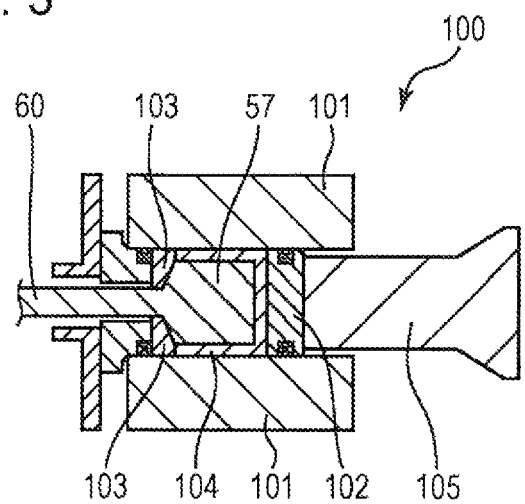
FIG. 3 is a sectional view of a hydrostatic extrusion apparatus to produce the metal heat sink 1 shown in FIG. 1.

In the extrusion step, the extrusion burette 57 including the composite columnar member 240 is heated to 700° C. and extrusion is executed using the extrusion apparatus 100 (refer to FIG. 3). In this manner, the extruded member 60 (refer to FIG. 4) with a diameter of cross-section viewed from the axial direction of 40 mm is obtained.

In the size-finishing step, the perimeter of the extruded member 60 is ground by lathing or the like in such a way that the diameter of the perimeter becomes 35 mm to remove the portion corresponding to the tubular member 55 in the extruded member 60. Then, the metal heat sink 201 is obtained through the above-described slice step.

Meanwhile, the metal heat sink 201 having a circular shape in a plan view may be made into a tetragonal shape in a plan view by being subjected to processing, e.g., rolling, cutting, and stamping.

Third Embodiment

Figure 10:
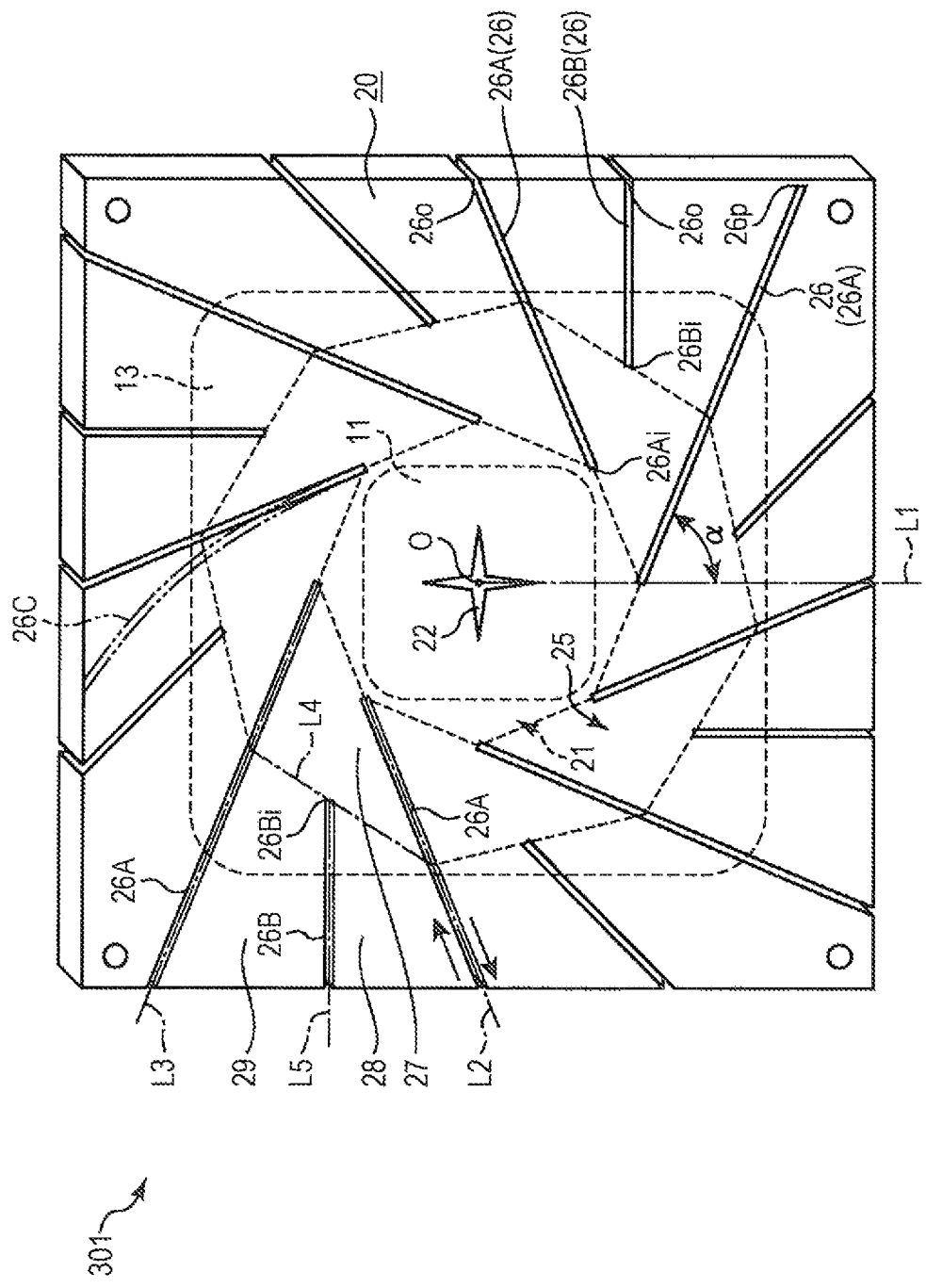
FIG. 10 is a diagram corresponding to FIG. 2 of a metal heat sink according to a third embodiment.

As for a metal heat sink 301 in a third embodiment, points different from the first embodiment will be described with reference to FIG. 10. As shown in FIG. 2, the metal heat sink 1 in the above-described first embodiment is provided with the buried metals 30 buried in the peripheral slits 26. On the other hand, as shown in FIG. 10, the metal heat sink 301 in the third embodiment corresponds to the metal heat sink 1 in the above-described first embodiment, in which the buried metals 30 (refer to FIG. 2) have been removed and, thereby, the peripheral slits 26 are hollow.

Next, a method for manufacturing the metal heat sink 301 will be described. The method for manufacturing the metal heat sink 301 further includes an elution step in addition to the individual steps of the method for manufacturing the metal heat sink 1 (refer to FIG. 2) in the first embodiment. The elution step is a step to elute the buried metals 30 (refer to FIG. 2) from extruded member 60, which includes the composite columnar member 40 contracted in the extrusion step (refer to FIG. 4), by removing the buried metals 30 from the extruded member 60 through heating, an acid-base reaction, or dissolution with a solvent.

The case where the buried metal 30 is eluted through heating will be described.

The tabular member 50 used in the assembling step, that is, the member for forming the buried metal 30 (refer to FIG. 4), is made from a low-melting point metal. The melting point of this low-melting point metal is at least lower than the melting point of the metal plate 20 (refer to FIG. 2) and is lower than the level of, for example, the melting point (230° C.) of Sn.

In the elution step, the composite columnar member 40 after extrusion (refer to FIG. 4) is heated. As a result, the buried metal 30 shown in FIG. 2 is eluted from the peripheral slit 26, so that the peripheral slit 26 becomes hollow. In this regard, the elution step may be performed in the state in which elution of the buried metal 30 is possible. That is, the elution step may be performed after the size-finishing step or be performed after the slice step. Meanwhile, the same goes for the case where the buried metal 30 is eluted through the acid-base reaction or the dissolution with a solvent.

The case where the buried metal 30 is eluted through the acid-base reaction will be described. The tubular member 50 (refer to FIG. 4) used in the assembling step is made from a metal having the corrosion resistance to an acid or alkaline solution. In the elution step, the buried metal 30 is eluted from the peripheral slit 26 by immersing the composite columnar member 40 after extrusion into the acid or alkaline solution which is a solution capable of dissolving the buried metal 30.

The case where the buried metal 30 is eluted by a solvent will be described. The tubular member 50 (refer to FIG. 4) used in the assembling step is made from an oxide material which dissolves into the solvent. In the elution step, the buried metal 30 is eluted from the peripheral slit 26 by immersing the composite columnar member 40 after extrusion into the solvent solution.

Advantage 11

The metal heat sink 301 shown in FIG. 10 is a heat sink in which the buried metals 30 shown in FIG. 2 in the metal heat sink 1 of the first embodiment are omitted and, thereby, the peripheral slits 26 are hollow. In the metal plate 20, portions located on both sides of the peripheral slit 26, while sandwiching the peripheral slit 26, are shear-deformed along the peripheral slit 26 more easily because the peripheral slit 26 is hollow. Consequently, the mountain-like thermal distortion of the metal heat sink 301 can be further suppressed.

Advantage 12

The method for manufacturing the metal heat sink 301 shown in FIG. 10 includes the above-described assembling step, extrusion step, slice step, and elution step. The elution step is a step to elute the buried metals 30 (refer to FIG. 2) from the composite columnar member 40 (refer to FIG. 4) contracted in the extrusion step through heating, an acid-base reaction, or dissolution with a solvent of the buried metals 30 in the composite columnar member 40.

According to this manufacturing method, the metal heat sink 301 including hollow peripheral slits 26 can be produced reliably.

Modified Example of Third Embodiment

In the above-described third embodiment, the peripheral slits 26 are made hollow by removing the buried metals 30 (refer to FIG. 2) from the metal heat sink 1. However, the peripheral slits 26 may be formed by a step to die-stamp one flat metal plate. This method for forming the peripheral slits 26 is particularly effective in the case where the metal heat sink 301 is thin. For further details, for example, in the case where the amount of heat generation of the electronic part 11 is relatively smaller than usual and in the case where the cycle of occurrence of heat generation of the electronic part is relatively slow, the thermal diffusion performance required of the metal heat sink 301 is relatively low. In that case, it is possible to decrease the thickness of the metal heat sink 301 to, for example, 1 mm or less. In the case where the metal heat sink 301 is thin as described above, the peripheral slit 26 is processed into a predetermined shape by common die stamping easily, so that the peripheral slit 26 is easily clearly processed. Furthermore, the metal heat sink 301 is not distorted easily even when die stamping is performed.

Advantage 13

The metal heat sink 301 is bonded to the insulating heat sink 13 or the electronic part 11 and, in addition, has a thermal expansion coefficient larger than the thermal expansion coefficient of the insulating heat sink 13. The metal heat sink 301 is provided with a center portion 21 bonded to the insulating heat sink 13 and the plurality of hollow linear peripheral slits 26 formed in a whirl-like radial manner and in such a way as to surround the center portion 21. Consequently, the same advantage that the mountain-like thermal distortion of the metal heat sink 301 can be further suppressed as the above-described item (Advantage 11) is obtained.

Advantage 14

The metal heat sink 301 is produced by a manufacturing method including a step to form the peripheral slits 26 by die-stamping one flat metal plate. Therefore, the metal heat sink 301 can be produced simply as compared with the case where the hollow peripheral slits 26 are formed by eluting the buried metals 30.

Fourth Embodiment

Figure 11:
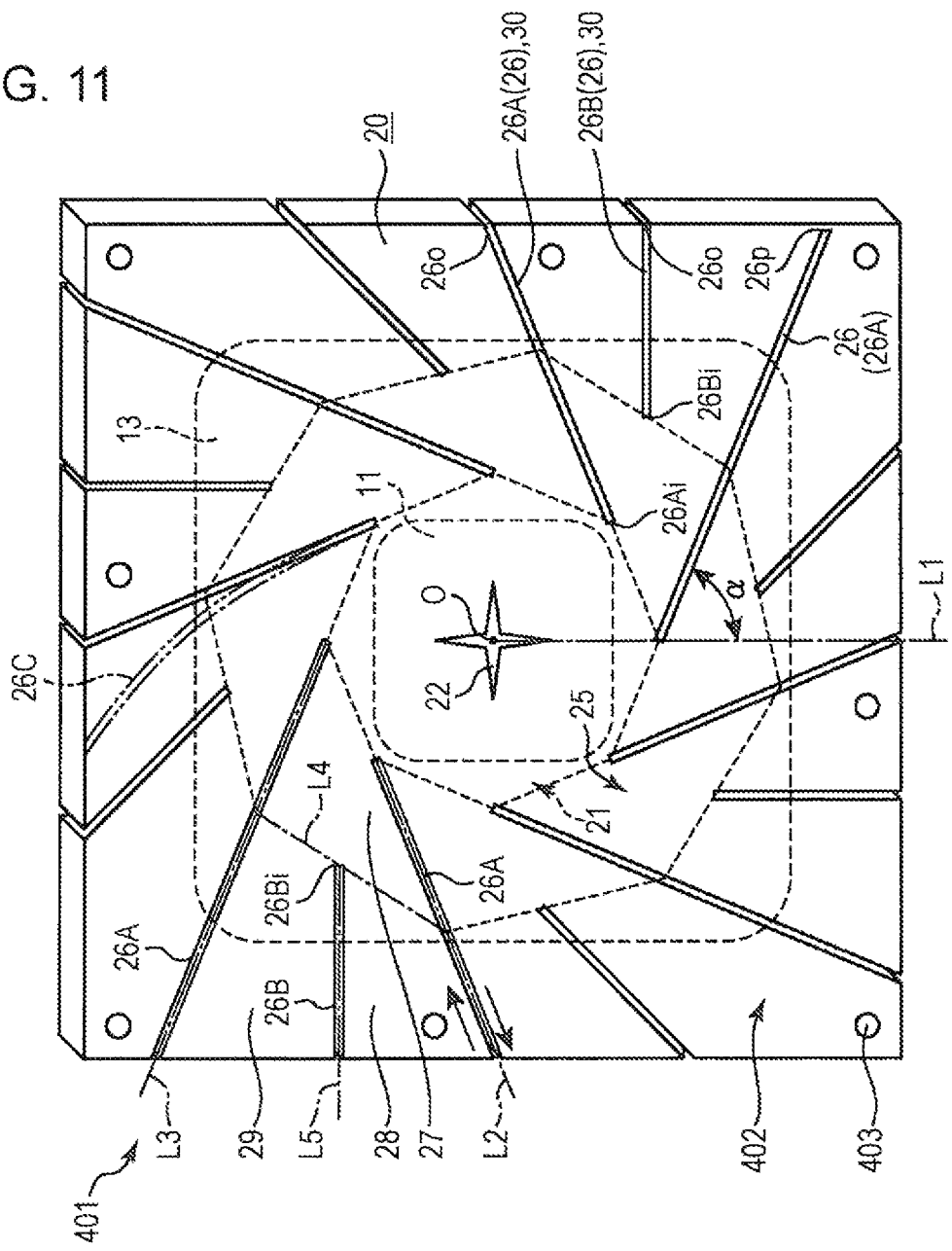
FIG. 11 is a diagram corresponding to FIG. 10 of a metal heat sink according to a fourth embodiment.

As for a metal heat sink 401 in a fourth embodiment, points different from the third embodiment will be described with reference to FIG. 11. FIG. 11 is a diagram, which corresponds to FIG. 10, of a metal heat sink according to the fourth embodiment. Although FIG. 10 shows the surface to be bonded to the electronic part 11, that is, the surface viewed from the electronic part 11, of the metal heat sink 301 as the surface side, FIG. 11 shows the surface to come into contact with the heat sink 15, put another way, the surface viewed from the heat sink 15 side, of the metal heat sink 401 as the surface side. In this regard, the same portions as those in the metal heat sink 301 are indicated by the same reference numerals as those set forth above. Also, for the sake of brevity, in FIG. 11, only part of a plurality of fixing portions 403 are indicated by a reference numeral.

In the metal heat sink 401 shown in FIG. 11, part of the surface on the heat sink 15 side of a peripheral portion 402 of the metal plate 20 are fixed to the heat sink 15, and portions excluding the part of the surface on the heat sink 15 side of the peripheral portion 402 are not fixed to the heat sink 15. Specifically, as shown in FIG. 11, 8 places in the region of the outer edge portion 402 (hereafter these 8 places are referred to as fixing portions 403) are fixed to the heat sink 15. However, it is enough that the outer edge portion 402 is fixed to the heat sink 15 by at least 3 places of fixing portions 403 present in the region of the outer edge portion 402. Here, the term "fixing" refers to that the fixing portion 403 is not displaced relative to the heat sink 15, and corresponds to fix firmly by for example, spark welding and FSW (Friction Stir Welding). This "fixing" does not include bonding by soldering or brazing. The fixing portion 403 is disposed at one place on a between adjacent two slits 26A basis. Meanwhile, as described above, it is enough that there are at least 3 places of fixing portions 403. Alternatively, the whole outer edge portion 402 may be fixed to the heat sink 15. In this regard, the outer edge portion 402 refers to a portion which is part of a peripheral portion 25 and which include perimeter of the metal heat sink 401.

(Deformation Due to Heat)

Figure 12:
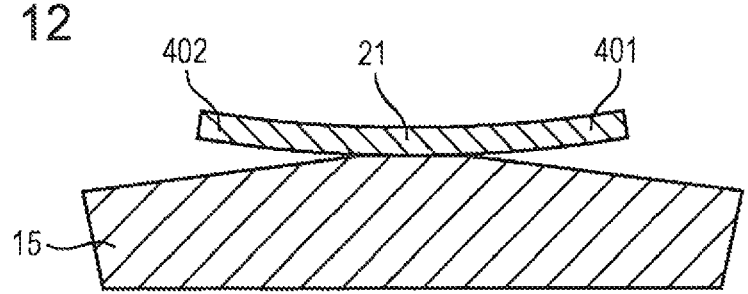
FIG. 12 is a schematic diagram showing the manner of deformation of a metal heat sink and a heat sink.
Figure 13:
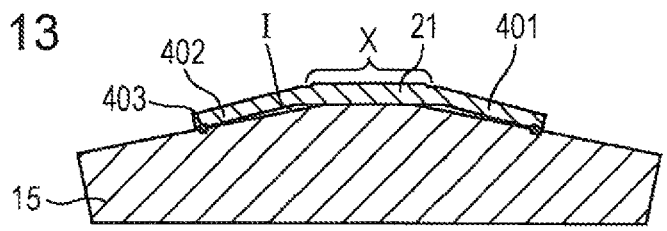
FIG. 13 is a schematic diagram showing the manner of deformation of a metal heat sink and a heat sink.

Next, deformation of the metal heat sink 401 and the heat sink 15, which occurs in the case where the electronic part 11 generates heat at a high density, will be described with reference to FIG. 12 and FIG. 13. FIG. 12 and FIG. 13 are schematic diagrams showing the manner of deformation of the metal heat sink 401 and the heat sink 15. FIG. 12 shows the manner of deformation in the case where the metal heat sink 401 and the heat sink 15 are not fixed to each other. FIG. 13 shows the manner of deformation in the case where the metal heat sink 401 and the heat sink 15 are fixed to each other at the fixing portions 403 and are not fixed to each other except the fixing portions 403. In this regard, the sizes of the plate surfaces of the metal heat sinks shown in FIG. 12 and FIG. 13 are smaller than the sizes of the heat sinks 15.

When the electronic part 11 generates heat at a high density, the heat is conducted to the metal heat sink 401 through the insulating heat sink 13. At this time, in the metal heat sink 401, as with the above-described first to third embodiments, an occurrence of the mountain-like thermal distortion is suppressed and, in addition, the heat is diffused to the outer side of the metal heat sink 401 in a plan view. On the other hand, the heat conducted to the metal heat sink 401 is conducted to the heat sink 15. The temperature of the portion on the metal heat sink 401 side, in particular the portion in contact with the center portion 21, of the heat sink 15 becomes high, and the temperature of the portion, which is located on the side opposite thereto (the lower sides in FIG. 12 and FIG. 13) and in which cooling water passes, is low. As a result, in the heat sink 15, a difference in thermal expansion coefficient occurs in the thickness direction (in the direction perpendicular to the plate surface) and, thereby, mountain-like thermal distortion occurs. Consequently, the heat sink 15 is deformed into the shape of a mountain in which the top is the portion in contact with the center portion 21.

Here, in the case where the metal heat sink 401 is not fixed to the heat sink 15, the metal heat sink 401 is deformed in such a way that the outer edge portion 402 warps toward the insulating heat sink 13 (not shown in FIG. 12) side. This is because the mountain-like thermal distortion which is the deformation in the thickness direction is dispersed to the plate surface direction orthogonal to the thickness direction and there is a difference between the thermal expansion coefficient of the metal heat sink 401 and the thermal expansion coefficient of the electronic part 11. As a result, as shown in FIG. 12, the metal heat sink 401 and the heat sink 15 come into contact in the center portion 21 of the metal heat sink 401, but does not come into contact in the outer edge portion 402. Therefore, the heat dissipation effect from the metal heat sink 401 to the heat sink 15 is good in the vicinity of the center portion 21, but is reduced in the vicinity of the outer edge portion 402 as compared with that in the vicinity of the center portion 21. Also, in the case where the center portion 21 of the metal heat sink 401 is fixed to the heat sink 15 and the metal heat sink 401 excluding the center portion 21 is not fixed to the heat sink 15, the outer edge portion 402 warps toward the insulating heat sink side. In this case as well, the heat dissipation effect of the metal heat sink 401 is reduced.

On the other hand, in the case where the outer edge portion 402 of the metal heat sink 401 is fixed to the heat sink 15 and the metal heat sink 401 excluding the outer edge portion 402 is not fixed to the heat sink 15, the outer edge portion 402 is suppressed from warping toward the insulating heat sink 13 (not shown in FIG. 13) side. Therefore, as shown in FIG. 13, the metal heat sink 401 and the heat sink 15 come into contact in the center portion 21 and the outer edge portion 402 of the metal heat sink 401. Consequently, the heat dissipation effect from the metal heat sink 401 to the heat sink 15 is good in both the center portion 21 and the outer edge portion 402. Meanwhile, the peripheral slits 26 in a whirl-like radial manner are formed in the metal heat sink 401, so that the metal heat sink 401 has flexibility. Therefore, the flatness is maintained around the center portion 21 (region X in FIG. 13) of the metal heat sink 401. As a result, peeling between the metal heat sink 401 and the insulating heat sink 13 is suppressed.

Meanwhile, in the vicinity of the midpoint of the center portion 21 and the outer edge portion 402 of the metal heat sink 401, a gap I is generated between the metal heat sink 401 and the heat sink 15. Consequently, in the vicinity of the midpoint concerned, the heat dissipation effect is reduced as compared with those in the center portion 21 and the outer edge portion 402. However, the metal heat sink 401 is in contact with the heat sink 15 with grease G (refer to FIG. 1) except the fixing portions 403. Therefore, the grease G enters the gap I. As a result, in the vicinity of the midpoint concerned as well, the thermal conductivity between the metal heat sink 401 and the heat sink 15 is maintained. In this regard, solder, in particular low-temperature solder, thermal compound, oil, and the like may be used in place of the grease G. Meanwhile, the gap generated because of deformation is about 1 μm.

Even when the outer edge portion 402 of the metal heat sink 401 is fixed to the heat sink 15, the mountain-like thermal distortion of the metal heat sink 401, which is deformation in the thickness direction of the metal heat sink 401, is dispersed in the plate surface direction orthogonal to the thickness direction of the metal heat sink 401 and is converted to deformation in the plate surface direction thereof. This is because the peripheral slits 26 are disposed in a whirl-like radial manner in the metal heat sink 401. That is, the metal heat sink 401 is deformed as described in the items (i) and (ii) below because the peripheral slits 26 are disposed.

(i) The center portion 21 is led to rotational deformation centering the center O in a plan view. In the case of the configuration shown in FIG. 11, the center portion 21 is led to counterclockwise rotational deformation.

(ii) In the peripheral portion 25, portions located on both sides of the peripheral slit 26, while sandwiching the peripheral slit 26, in a plan view, are shear-deformed in such a way as to follow the rotational deformation of the center portion 21.

Advantage 15

In the metal heat sink 401, the surface on the heat sink 15 side of the outer edge portion 402 of the metal plate 20 is fixed to the heat sink 15, and the portion excluding the outer edge portion 402 is not fixed to the heat sink 15. Consequently, even when the metal heat sink 401 and the heat sink 15 are deformed, the outer edge portion 402 of the metal heat sink 401 is in contact with the heat sink 15 and the flatness is maintained in the vicinity of the center portion 21 of the metal heat sink 401. As a result, the heat dissipation effect from the metal heat sink 401 to the heat sink 15 is improved and, in addition, peeling between the metal heat sink 401 and the insulating heat sink 13 is suppressed.

Meanwhile, in the present embodiment, the metal heat sink 401 in which the insides of the peripheral slits 26 are hollow are used. However, a metal heat sink in which the buried metals 30 are buried in the insides of the peripheral slits 26 (refer to FIG. 2) may be used.

EXAMPLES

Next, results of thermal stress analysis based on the displacements of the individual portions and results of thermal analysis based on the temperatures of the individual portions, where the electric part 11 was allowed to generate heat at a high density, will be described with reference to FIG. 14 to FIG. 22.

(Analytical Model)

Sizes materials of the individual portions of a model of an electronic part apparatus 10 used in the analysis were as described below. In this analysis, a circular metal heat sink in a plan view was used. In this regard, in order to distinguish from the above-described metal heat sink 401, the metal heat sink used in the analysis concerned was referred to as a metal heat sink 401A. The metal heat sink 401A was not provided with the insulating heat sink 13 and was bonded to the electric part 11 through solder S.

Electric part 11: diameter ϕ 10 mm×thickness 150 μm, material Si

Solder S: diameter ϕ 10 mm×thickness 50 μm, material Sn—Ag—Cu

Metal heat sink 401A: diameter ϕ 30 mm×thickness 2 mm, material Cu

Heat sink 15: diameter ϕ 50 mm×thickness 10 mm, material Al

In the analysis concerned, the temperature of the lower end of the heat sink 15 was set at 65° C. constantly. Also, eight slits 26A and eight slits 26B were formed. Also, the metal heat sink 401A and the heat sink 15 were fixed to each other by fixing portions 403 disposed at eight places in the outer edge portion 402 of the metal heat sink 401A. The fixing portion 403 was disposed at one place on a between adjacent two slits 26A basis. Both the gap in the slit 26A and the gap in the slit 26B, that is, the width of the slit 26A and the width of the slit 26B, were specified to be 0.1 mm. Meanwhile, the center slit 22 (refer to FIG. 11) was not disposed. Furthermore, the metal heat sink 401A and the heat sink 15 were set to be in contact with each other thermally completely and, in addition, were set to be able to slide sideways freely relative to each other.

The analytical model configured as described above was taken as an example and an analytical model not provided with the peripheral slits 26 (slits 26A and slits 26B) was taken as a comparative example. An electric power of 175 W was applied to the electric part 11 from above, and thermal stress analysis based on displacements of the individual portions and thermal analysis based on the temperatures of the individual portions were performed. In this regard, hereafter the metal heat sink of the analytical model in the comparative example not provided with the peripheral slits 26 is referred to as a metal heat sink 401B.

(Results of Thermal Stress Analysis)

Figure 14:
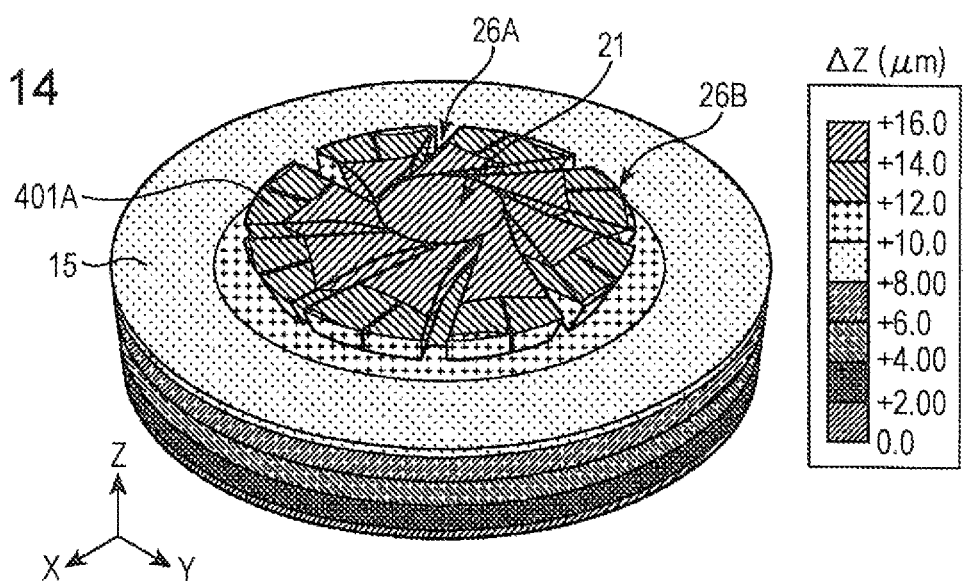
FIG. 14 is a perspective view of a metal heat sink and a heat sink showing the thermal stress analysis results of an analysis model according to an example.
Figure 15:
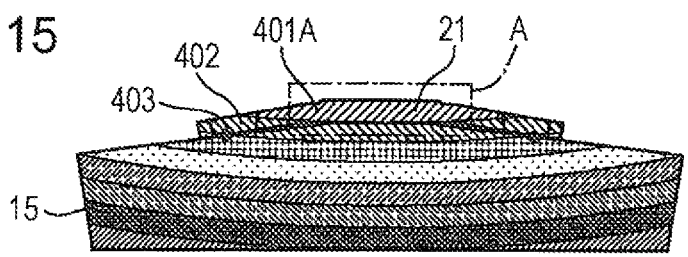
FIG. 15 is a side view of a metal heat sink and a heat sink showing the thermal stress analysis results of an analysis model according to an example.
Figure 16:
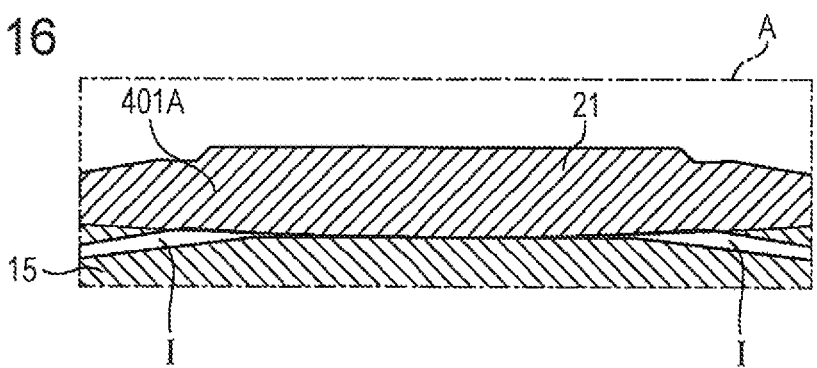
FIG. 16 is a magnified diagram of an A portion shown in FIG. 15.
Figure 17:
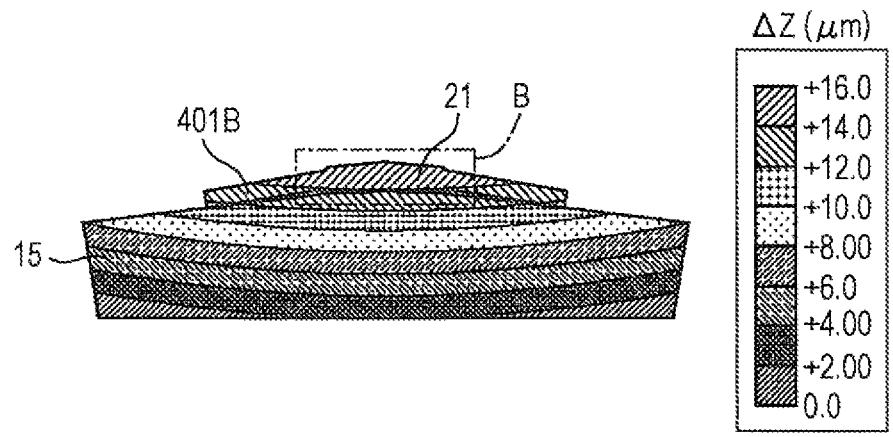
FIG. 17 is a diagram corresponding to FIG. 15 showing the thermal stress analysis results of an analysis model according to a comparative example.
Figure 18:
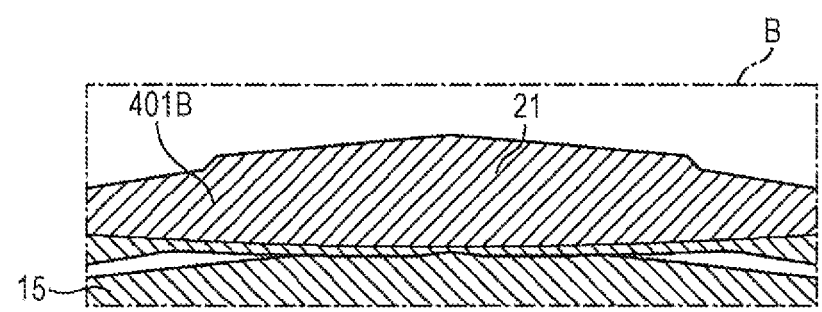
FIG. 18 is a magnified diagram of a B portion shown in FIG. 17.

The results of the thermal stress analysis of the analytical model according to the example are shown in FIG. 14 to FIG. 16. FIG. 14 is a perspective view, FIG. 15 is a side view, and FIG. 16 is a magnified diagram of an A portion shown in FIG. 15. Also, the results of the thermal stress analysis of the analytical model according to the comparative example are shown in FIG. 17 and FIG. 18. FIG. 17 is a side view and FIG. 18 is a magnified diagram of a B portion shown in FIG. 17. In this regard, ΔZ described in FIG. 14 and FIG. 17 indicates the displacement in the Z direction. Meanwhile, the electric part 11 and the solder S are not shown in FIG. 14 to FIG. 18.

As is clear from FIG. 14, the widths of the slits 26A increased. This is because the center portion 21 in FIG. 14 was led to counterclockwise rotational deformation centering the center O in a plan view and, thereby, the mountain-like thermal distortion was dispersed in the plate surface direction of the metal heat sink. Also, it is clear that in the metal heat sink 401A, the displacement in the Z axis direction increased with increasing proximity to the center portion 21. This is because the heat sink 15 was deformed into the shape of a mountain.

As is clear from FIG. 15 and FIG. 16, the flatness is maintained around the center portion 21 of the metal heat sink 401A. Also, it is clear that the heat sink 15 was deformed into the shape of a mountain and, thereby, the vicinity of the center portion 21 of the metal heat sink 401A was in contact with, put another way, adhered to, the heat sink 15. Meanwhile, the outer edge portion 402 of the metal heat sink 401A and the heat sink 15 were in contact with each other at the fixing portions 403. In this regard, the gap I was generated between the metal heat sink 401 and the heat sink 15. On the other hand, as is clear from FIG. 17 and FIG. 18, in the case where the peripheral slits 26 were not disposed in the metal heat sink, the vicinity of the center portion 21 of the metal heat sink 401B was deformed into the shape of a mountain. Therefore, in this case, the metal heat sink 401B and the insulating heat sink 13 are peeled from each other easily.

(Results of Thermal Analysis)

Figure 19:
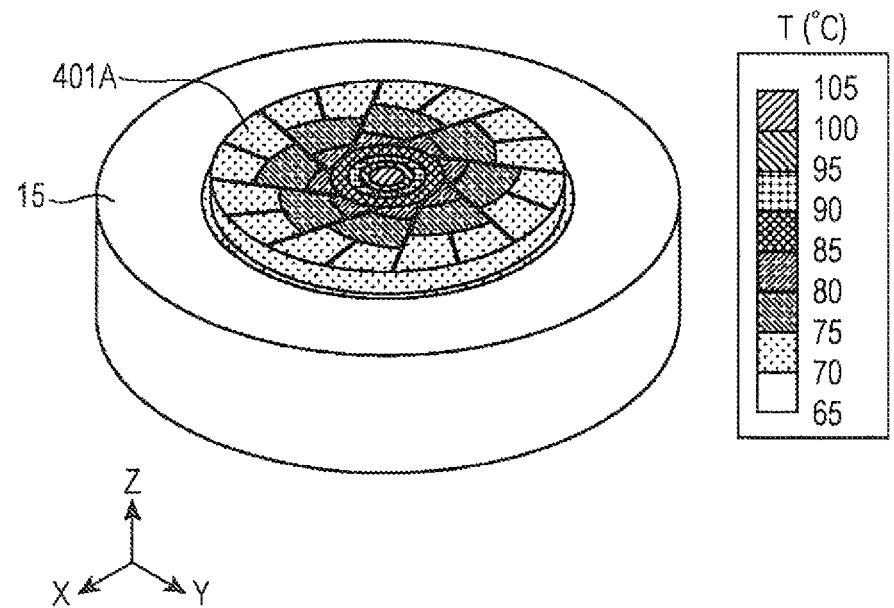
FIG. 19 is a perspective view of a metal heat sink and a heat sink showing the thermal stress analysis results of an analysis model according to an example.
Figure 21:
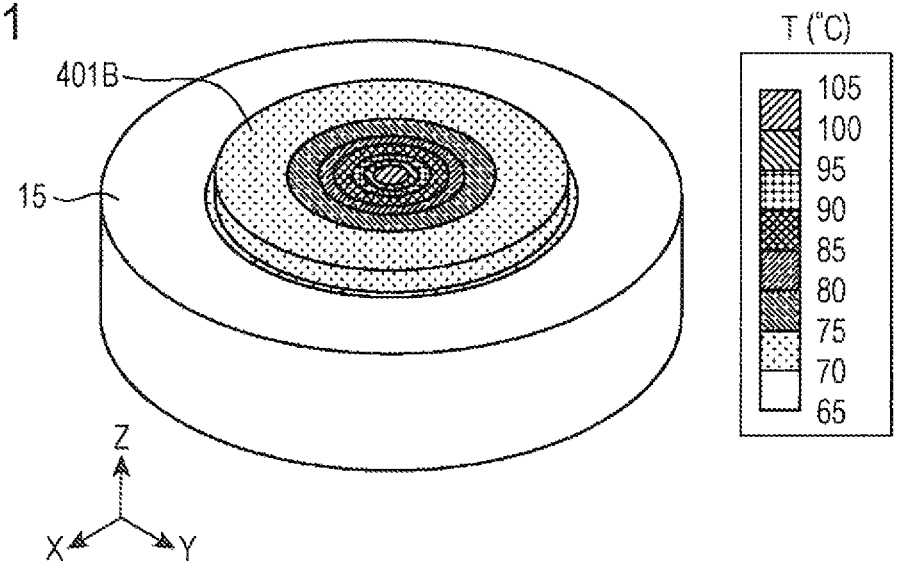
FIG. 21 is a diagram corresponding to FIG. 19 showing the thermal stress analysis results of an analysis model according to a comparative example.
Figure 22:
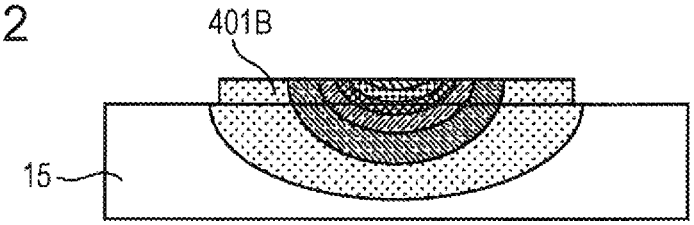
FIG. 22 is a diagram corresponding to FIG. 20 showing the thermal stress analysis results of an analysis model according to a comparative example.

The results of the thermal analysis are shown in FIG. 19 to FIG. 22. FIG. 19 is a perspective view of the example. FIG. 20 is a side view of the comparative example. FIG. 21 is a perspective view of the comparative example. FIG. 22 is a side view of the comparative example. In this regard, the electric part 11 and the solder S are not shown in FIG. 19 to FIG. 22. As is clear from FIG. 19 to FIG. 22, the thermal diffusibility and the heat dissipation effect from the metal heat sink 401A or 401B to the heat sink 15 are hardly changed between the case where the peripheral slits 26 are disposed and the case where the peripheral slits 26 are not disposed. Therefore, it can be said that the peripheral slits 26 do not hinder the thermal diffusibility and the heat dissipation effect.

Modified Example of Fourth Embodiment

Next, Modified examples 4-1 to 4-5 of the fourth example will be described with reference to FIG. 23 to FIG. 27. In the above-described fourth embodiment, the peripheral slits 26 (refer to FIG. 11) were specified to have a straight line shape. On the other hand, in the modified examples of the fourth example, slits 412, 422, 432, 442, and 452 corresponding to the slits 26A (refer to FIG. 11) in the above-described fourth embodiments were specified to have a curved shape. In this regard, in the modified examples, slits corresponding to the slits 26B (refer to FIG. 11) in the above-described fourth embodiment are not disposed. Metal heat sinks 411, 421, 431, 441, and 451 in the modified examples of the fourth embodiment are circular in a plan view. Meanwhile, in the modified examples, the center slits 22 (refer to FIG. 11) in the above-described fourth embodiment are not disposed. In this regard, the center portion 21 in the present modified example is circular.

The metal heat sinks in Modified examples 4-1 to 4-5 are provided with eight peripheral slits having a curved shape. In addition, in the individual modified examples, the eight peripheral slits are formed having the same shape. In this regard, the number of the peripheral slits may be 7 or less or 9 or more. Alternatively, the shapes of the eight peripheral slits may be different from each other.

Modified Example 4-1

Figure 23:
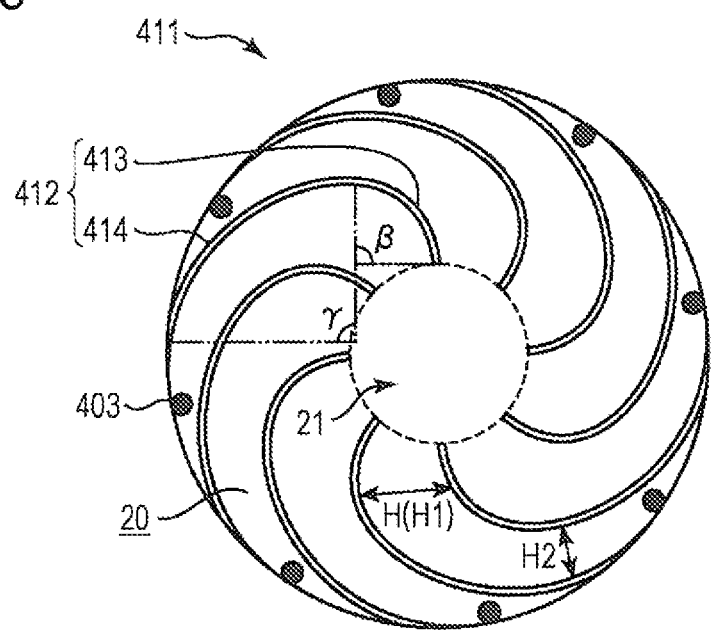
FIG. 23 is a plan view of a metal heat sink according to Modified example 4-1 of a fourth embodiment.

FIG. 23 shows Modified example 4-1 in the fourth embodiment. In the metal heat sink 411 in Modified example 4-1, a plurality of peripheral slits 412, in which two arcs having mutually different curvature radii are combined, are disposed. Each peripheral slit 412 is composed of a first slit 413 extending along the radial direction of the metal heat sink 411 and a second slit 414 extending from the end of the first slit 413 and having a curvature radius larger than the curvature radius of the first slit 413. The first slit 413 extends substantially parallel to the radius direction of the metal heat sink 411. Each peripheral slit 412 is composed of such a first slit 413 and a second slit 414, so that as for the width H of a region located between adjacent peripheral slits 412 in the metal plate 20, the width between adjacent first slits 413 and the width between adjacent second slits 414 are different. Specifically, the width H2 between adjacent second slits 414 is smaller than the width H1 between adjacent first slits 413. The first slit 413 is in contact with the perimeter of the center portion 21 while forming a wide angle. Put another way, the first slit 413 is in contact with the perimeter of the center portion 21 while forming substantially a right angle. Hereafter the term "contact while forming a wide angle" refers to the same. The second slit 414 is in contact with the perimeter of the metal heat sink 411 gently. Put another way, the second slit 414 is in contact with the perimeter of the metal heat sink 411 in such a way as to become parallel thereto. Hereafter the term "contact gently" refers to the same. Meanwhile, the center angle β of an arc of the first slit 413 and the center angle γ of an arc of the second slit 414 are 90°. However, these center angles β and γ are not limited to 90°. Meanwhile, the direction of forming of an arc by the peripheral slit 412 is a counterclockwise direction in a plan view shown in FIG. 23. In this regard, the direction of forming of an arc by the peripheral slit 412 may be a clockwise direction in a plan view.

Modified Example 4-2

Figure 24:
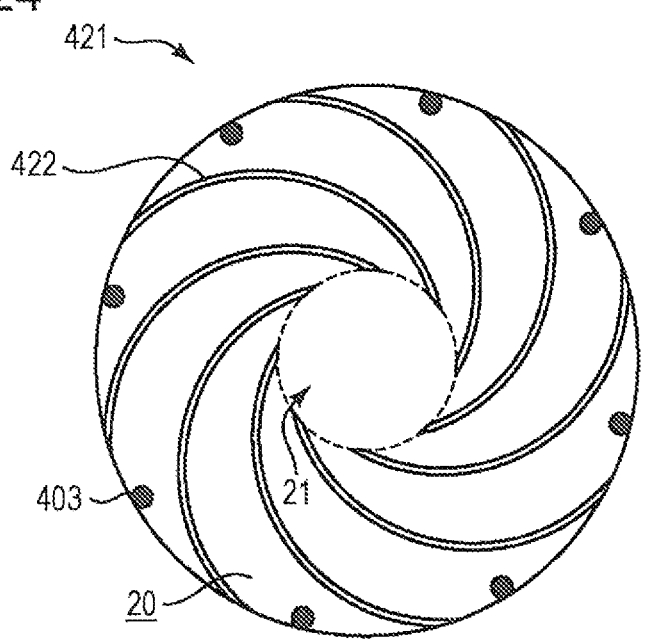
FIG. 24 is a plan view of a metal heat sink according to Modified example 4-2 of the fourth embodiment.

FIG. 24 shows Modified example 4-2 in the fourth embodiment. In the metal heat sink 421 in Modified example 4-2, a plurality of peripheral slits 422 formed from a single arc are disposed. Each peripheral slit 422 is a slit having a curvature radius larger than the radius of the region of the center portion 21. Meanwhile, each peripheral slit 422 is in contact with the perimeter of the center portion 21 and the perimeter of the metal heat sink 421 gently. In this regard, the each peripheral slit 422 may be formed in such a way that the curvature radius increases gradually with increasing proximity to the perimeter of the metal heat sink 421 from the perimeter of the center portion 21. Meanwhile, the direction of forming of an arc by each peripheral slit 422 is a counterclockwise direction in a plan view shown in FIG. 24. In this regard, the direction of forming of an arc by each peripheral slit 422 may be a clockwise direction in a plan view.

Modified Example 4-3

Figure 25:
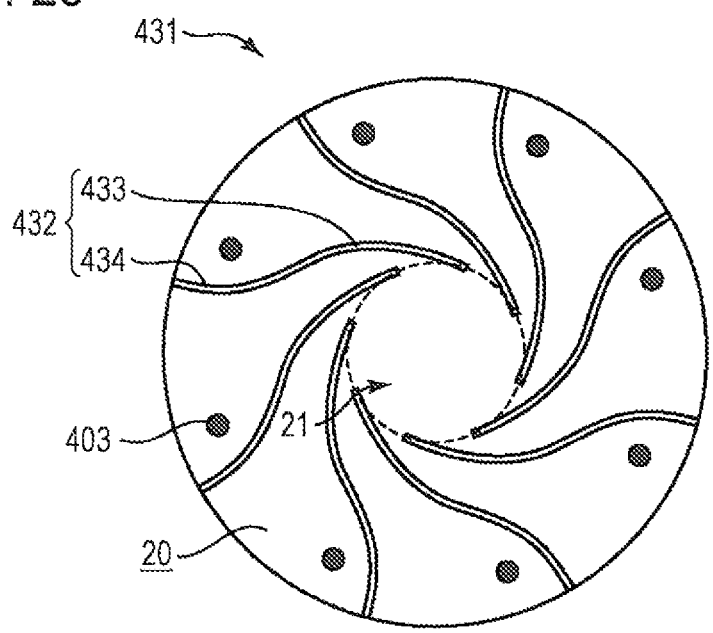
FIG. 25 is a plan view of a metal heat sink according to Modified example 4-3 of the fourth embodiment.

FIG. 25 shows Modified example 4-3 in the fourth embodiment. In the metal heat sink 431 in Modified example 4-3, a plurality of peripheral slits 432, in which two arcs having mutually different curvature radii and having mutually different directions of forming of an arc are combined, are disposed. Each peripheral slit 432 is composed of a first slit 433 in contact with the perimeter of the center portion 21 gently and a second slit 434 which extends from the end of the first slit 433 and which is in contact with the perimeter of the metal heat sink 431 while forming a wide angle. Therefore, as for a portion located between adjacent peripheral slits 432 in the metal plate 20, the width between adjacent second slits 434 is larger than the width between adjacent first slits 433. Meanwhile, the direction of forming of an arc by the first slit 433 is a counterclockwise direction in a plan view shown in FIG. 25, whereas the direction of forming of an arc by the second slit 434 is a clockwise direction in a plan view. In this regard, the order of the direction of forming of an arc by the first slit 433 and the direction of forming of an arc by the second slit 434 may be reverse to that described above. In addition, the first slit 433 is in contact with the perimeter of the center portion 21 more gently as compared with the peripheral slit 422 in Modified example 4-2 above.

Modified Example 4-4

Figure 26:
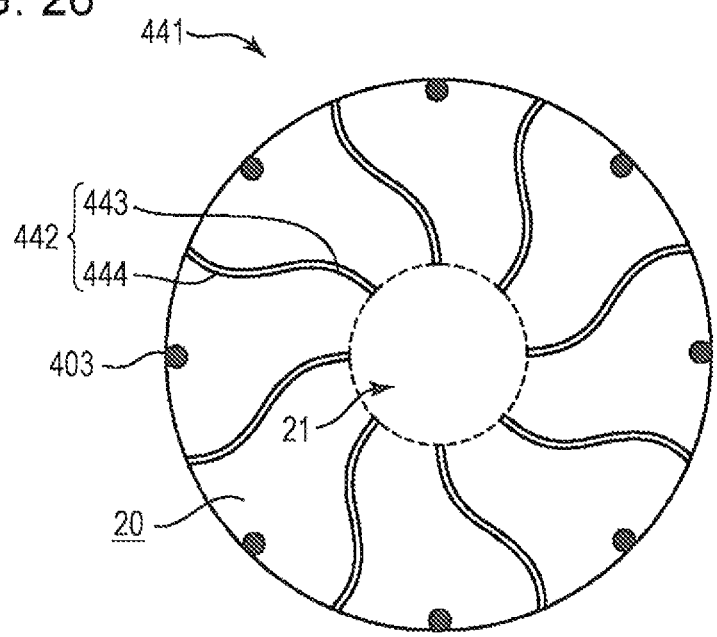
FIG. 26 is a plan view of a metal heat sink according to Modified example 4-4 of the fourth embodiment.

FIG. 26 shows Modified example 4-4 of the fourth embodiment. In the metal heat sink 441 in Modified example 4-4, a plurality of peripheral slits 442, in which two arcs having mutually different curvature radii and having mutually different directions of forming of an arc are combined, are disposed. Each peripheral slit 442 is composed of a first slit 443 extending along the radial direction of the metal heat sink 441 and a second slit 444 which extends from the end of the first slit 443 and which has substantially the same curvature radius as the curvature radius of the first slit 443. The first slit 443 extends substantially parallel to the radius direction of the metal heat sink 441. Meanwhile, the direction of forming of an arc by the second slit 444 is reverse to the direction of forming of an arc by the first slit 443. That is, the direction of forming of an arc by the first slit 443 is a counterclockwise direction in a plan view shown in FIG. 26, whereas the direction of forming of an arc by the second slit 444 is a clockwise direction in a plan view. In this regard, the order of the direction of forming of an arc by the first slit 443 and the direction of forming of an arc by the second slit 444 may be reverse to that described above. The first slit 443 is in contact with the perimeter of the center portion 21 of the metal heat sink 441 while forming a wide angle. Also, the second slit 444 is in contact with the perimeter of the metal heat sink 441 while forming a wide angle. As for a portion located between adjacent peripheral slits 442 in the metal plate 20, the width between adjacent second slits 444 is larger than the width between adjacent first slits 443.

Modified Example 4-5

Figure 27:
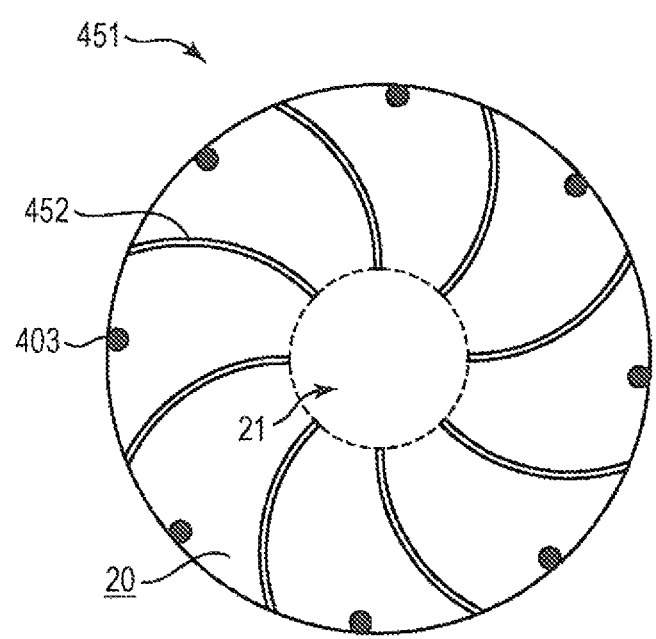
FIG. 27 is a plan view of a metal heat sink according to Modified example 4-5 of the fourth embodiment.

FIG. 27 shows Modified example 4-5 in the fourth embodiment. In the metal heat sink 451 in Modified example 4-5, a plurality of peripheral slits 452 formed from a single arc are disposed. Each peripheral slit 452 is a slit extending along the radial direction of the metal heat sink 451. Put another way, each peripheral slit 452 extends in such a way as to become parallel to the radius direction of the metal heat sink 451. Each peripheral slit 452 is in contact with the perimeter of the metal heat sink 451 and the perimeter of the center portion 21 while forming wide angles. Alternatively, each peripheral slit 452 may be formed in such a way that the curvature radius increases gradually with increasing proximity to the perimeter of the metal heat sink 451 from the perimeter of the center portion 21. Meanwhile, the direction of forming of an arc by each peripheral slit 452 is a counterclockwise direction in a plan view shown in FIG. 27. However, the direction of forming of an arc by each peripheral slit 452 may be a clockwise direction in a plan view. In this regard, the curvature radius of each peripheral slit 452 is smaller than the curvature radius of the peripheral slit 422 of the metal heat sink 421 in Modified example 4-2 above.

Advantages of Modified Examples 4-1 to 4-5

Next, advantages of Modified examples 4-1 to 4-5 will be described with reference to Table 1. Table 1 shows comparisons between the metal heat sink, in which straight line peripheral slits extending in a slanting direction relative to the radial direction (radius direction) of the metal heat sink are disposed, and the metal heat sinks in Modified examples 4-1 to 4-5 with respect to four items of thermal diffusibility, adhesion to heat sink, dispersibility of deformation, and magnitude of rotational displacement of center portion.

TABLE 1

|  | Straight-line slit | Modified example 4-1 | Modified example 4-2 | Modified example 4-3 | Modified example 4-4 | Modified example 4-5 |
| --- | --- | --- | --- | --- | --- | --- |
| Thermal diffusibility | ○ | ⊙ | ○ | ○ | ⊙ | ⊙ |
| Adhesion to heat sink | ○ | ○ | ⊙ | ⊙ | ○ | ○ |
| Dispersibility of deformation | ○ | ⊙ | ⊙ | ○ | ○ | ⊙ |
| Magnitude of rotational displacement of center portion | middle | large | large | small | small | middle |

(Thermal Diffusibility)

The heat diffuses from the center in a plan view of the metal heat sink to the outer side. The heat is conducted in the radial direction of the metal heat sink, although if the conduction is hindered by the peripheral slits, the thermal diffusibility is reduced. Consequently, the thermal diffusibility is improved as the peripheral slits are disposed along the radial direction of the metal heat sink. Put another way, the thermal diffusibility is improved as the peripheral slits are disposed in such a way as to become parallel to the radius direction of the metal heat sink. Therefore, according to the configuration of Modified examples 4-1, 4-4, and 4-5, the thermal diffusibility is more improved as compared with that of the metal heat sink provided with straight line peripheral slits extending in a slanting direction relative to the radial direction (radius direction) of the metal heat sink.

(Adhesion to Heat Sink)

The adhesion of the metal heat sink to the heat sink becomes better as the gap 1 (refer to FIG. 13) becomes small. In order to make this gap small, it is necessary that an intermediate portion between the perimeter of the center portion of the metal heat sink and the perimeter of the metal heat sink be deformed easily. Specifically, it is better that, in the intermediate portion between the perimeter of the center portion and the perimeter of the metal heat sink, the width of a region located between adjacent two peripheral slits is small. Therefore, according to the configuration of Modified examples 4-2 and 4-3, the adhesion to the heat sink is more improved as compared with that of the metal heat sink provided with straight line peripheral slits extending in a slanting direction relative to the radial direction (radius direction) of the metal heat sink. In this regard, according to the configuration of Modified example 4-3, the adhesion of the metal heat sink to the heat sink is the highest.

(Dispersibility of Deformation)

The dispersibility of deformation is better as a change in the width of the portion located between adjacent peripheral slits in the metal plate becomes small. This is because if a change in the width of this portion is large, deformation is concentrated on the region with a small width easily. Therefore, according to the configuration of Modified examples 4-1, 4-2, and 4-5, the dispersibility of deformation is more improved as compared with that of the metal heat sink provided with straight line peripheral slits extending in a slanting direction relative to the radial direction (radius direction) of the metal heat sink.

(Magnitude of Rotational Displacement of Center Portion)

The magnitude of rotational displacement of the center portion becomes large as the peripheral slits are bended leaning to one direction to a greater extent in a plan view of the metal heat sink. Therefore, in Modified examples 4-1 and 4-2, the rotational displacement of the center portion is large as compared with that of the metal heat sink provided with straight line peripheral slits extending in a slanting direction relative to the radial direction (radius direction) of the metal heat sink. On the other hand, in Modified examples 4-3 and 4-4 including peripheral slits in which two arcs having mutually different directions of forming of an arc are combined, the rotational displacement of the center portion is small as compared with that of the metal heat sink provided with straight line peripheral slits extending in a slanting direction relative to the radial direction (radius direction) of the metal heat sink. When the center portion is rotationally displaced, the electronic part 11 bonded to the metal heat sink is also rotated. As a result, for example, wiring and the like bonded to the electronic part 11 may be distorted. Therefore, Modified examples 4-3 and 4-4 exhibiting small rotational displacements of the center portion are preferable.

Advantage 16

In the metal heat sinks 411, 421, 431, 441, and 451, peripheral slits 412, 422, 432, 442, and 452 are specified to have a curved shape. Consequently, the metal heat sinks 411, 421, 431, 441, and 451 can improve at least one of the thermal diffusibility, the adhesion to heat sink, and the dispersibility of deformation as compared with that of the metal heat sink provided with straight line peripheral slits 26.

Fifth Embodiment

Figure 28:
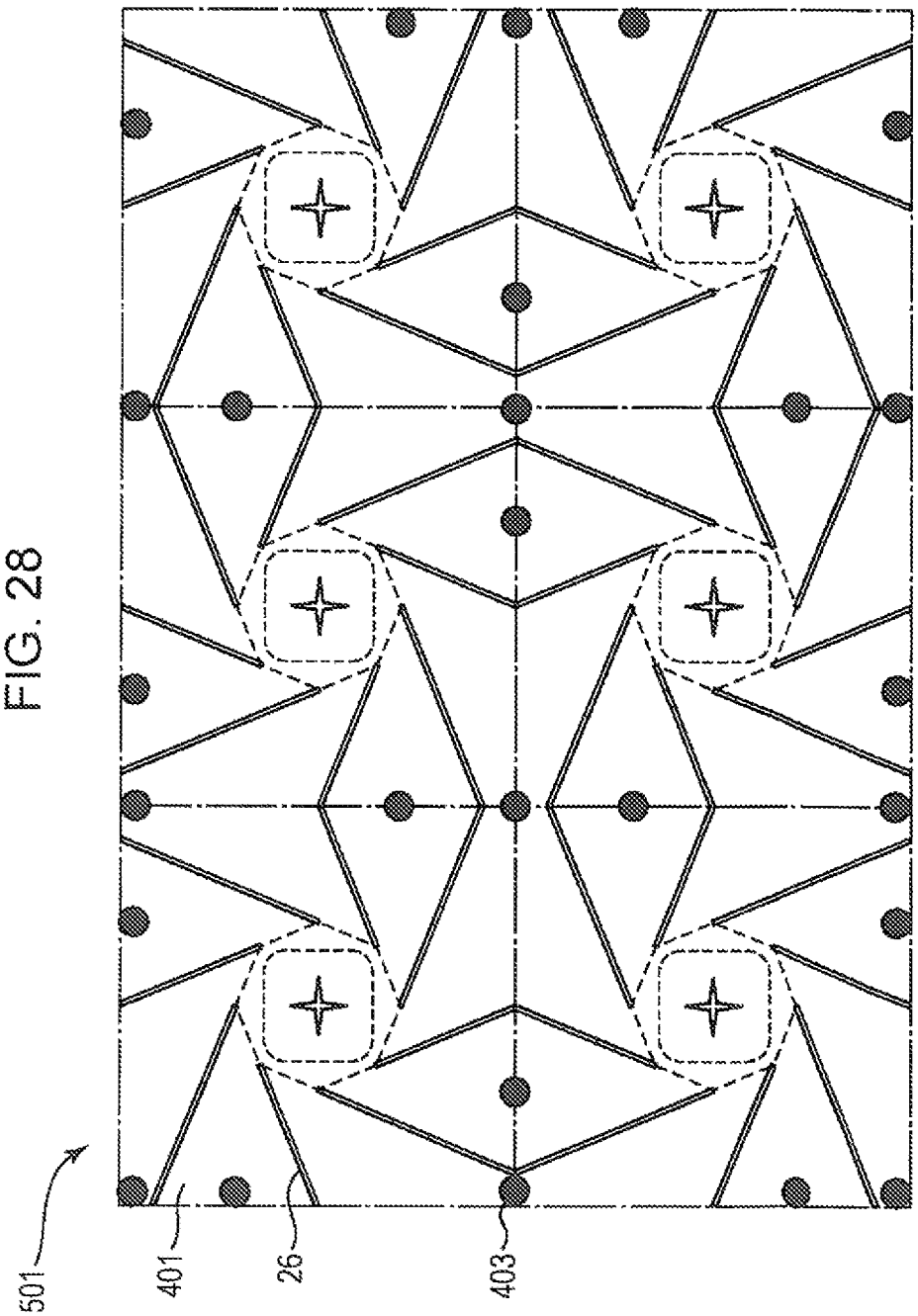
FIG. 28 is a plan view of a metal heat sink according to a fifth embodiment.

Next, a metal heat sink 501 of a fifth embodiment will be described with reference to FIG. 28. The metal heat sink 501 of the fifth embodiment is provided with a plurality of metal heat sinks 401 of the fourth embodiment. In this metal heat sink 501, the metal heat sinks 401 are arranged side by side as shown in FIG. 28. The electronic part apparatus 10 including a plurality of electronic parts 11 (refer to FIG. 1) can be provided by using the metal heat sink 501 having this configuration. In this regard, for the sake of brevity, in FIG. 28, only part of a plurality of metal heat sinks 401, a plurality of peripheral slits 26, and a plurality of fixing portions 403 are indicated by reference numerals.

As shown in FIG. 28, the metal heat sink 501 is formed by arranging the metal heat sinks 401 into 2 rows and 3 columns. In this regard, adjacent metal heat sinks 401 are arranged in such a way that the directions of the peripheral slits 26 become antisymmetric. However, the numbers of rows and columns of the metal heat sinks 401 are not limited to those described above. Alternatively, adjacent metal heat sinks 401 may be arranged in such a way that the directions of the peripheral slits 26 become symmetric. Meanwhile, in this embodiment, the peripheral slits 26 have a straight line shape, although the peripheral slits may have a curved shape as shown in, for example, Modified examples 4-1 to 4-5 of the fourth embodiment (refer to FIG. 23 to FIG. 27). Furthermore, in this embodiment, the outer edge portions 402 (refer to FIG. 11) of adjacent metal heat sinks 401 are fixed at part of the outer edge portions 402, although the whole outer edge portions 402 of adjacent metal heat sinks 401 may be fixed to each other. Meanwhile, in this embodiment, the metal heat sinks 401 provided with the peripheral slits 26, the insides of which are hollow, are used, although metal heat sinks including peripheral slits 26, the insides of which are filled with the buried metals 30 (refer to FIG. 2), may be used.

Other Modified Examples

As shown in FIG. 1, in the above-described embodiment, the electronic part apparatus 10 is formed by bonding the electronic part 11, the insulating heat sink 13, the metal heat sink 1, and the heat sink 15 in that order. However, the configuration related to the arrangement of the individual members and presence or absence of the individual members of the electronic part apparatus 10 can be changed variously. For example, the metal heat sink 1 may be arranged between the electronic part 11 and the insulating heat sink 13.

Outline of Embodiments

The above-described embodiments and the above-described modified examples are summarized as described below.

A heat sink according to the above-described embodiments and the above-described modified examples is a heat sink having one surface bonded to a member to be bonded and the other surface in contact with a cooling member, the heat sink is provided with a metal plate having a thermal expansion coefficient larger than that of the above-described member to be bonded, wherein the above-described metal plate is provided with a center portion where the above-described member to be bonded is bonded and a plurality of linear peripheral slits formed in a whirl-like radial manner and in such a way as to surround the above-described center portion.

In this heat sink, preferably, an outer edge portion of the surface on the above-described cooling member side of the above-described metal plate is fixed to the above-described cooling member by at least three fixing portions present in the outer edge portion concerned, and a portion excluding the above-described fixing portions in the surface on the above-described cooling member side of the above-described metal plate is configured to be displaceable relative to the above-described cooling member.

In the above-described heat sink, preferably, the above-described metal plate is provided with a plurality of linear center slits disposed in the above-described center portion, and the plurality of the above-described center slits intersect with each other at a center of the above-described center portion.

In the above-described heat sink, preferably, buried metals buried in the above-described peripheral slits are further included and the above-described buried metals are plastically deformed by a shearing stress along the above-described peripheral slits easily as compared with the above-described metal plate.

In the above-described heat sink, preferably, the above-described metal plate is made from pure Cu, pure Al, or an alloy thereof.

In the configuration in which the above-described buried metals are plastically deformed by a shearing stress along the peripheral slits easily as compared with the metal plate, the above-described buried metal may be made from Sn, Pb, Ag, Bi, Zn, Al, an alloy of at least two types of metals selected from them, pure Nb, or pure Ta.

In the configuration in which the above-described buried metals are plastically deformed by a shearing stress along the peripheral slits easily as compared with the metal plate, the above-described buried metal may be made from a Zn—Al alloy or a Zn—Al based superplastic metal.

In the above-described heat sink, the above-described peripheral slits may be hollow.

In the above-described heat sink, preferably, the above-described peripheral slits have a curved shape.

An example of methods for manufacturing the heat sink according to the above-described embodiments and the above-described modified examples is a method for manufacturing the heat sink having the configuration in which the above-described buried metals are plastically deformed by a shearing stress along the peripheral slits easily as compared with the metal plate, and the method includes the steps of assembling an integrated composite columnar member by allowing columnar members made from a material for forming the above-described metal plate to adhere to tabular members made from a material for forming the above-described buried metal in an assembling step, contracting the above-described composite columnar member formed in the above-described assembling step by hydrostatic extrusion in a direction orthogonal to the axial direction of the composite columnar member in an extrusion step, and slicing the above-described composite columnar member contracted in the above-described extrusion step along the surface orthogonal to the axial direction thereof in a slice step.

In this method for manufacturing the heat sink, the above-described metal plate may be made from pure Cu, the above-described buried metal may be made from pure Nb or pure Ta, and the extrusion temperature of the above-described hydrostatic extrusion may be a temperature within the temperature range of 600° C. to 900° C.

In the above-described method for manufacturing the heat sink, the above-described metal plate may be made from pure Al, the above-described buried metal is made from pure Ta, and the extrusion temperature of the above-described hydrostatic extrusion may be a temperature within the temperature range of 200° C. to 600° C.

In the above-described method for manufacturing the heat sink, the above-described metal plate may be made from pure Cu or pure Al, the buried metal may be made from Sn, Pb, Ag, Bi, Zn, Al, or an alloy of at least two types of metals selected from them, and the extrusion temperature of the above-described hydrostatic extrusion may be 200° C. or lower.

In the above-described method for manufacturing the heat sink, the extrusion temperature of the above-described hydrostatic extrusion may be 200° C. or lower, in the above-described assembling step, foil may be sandwiched at the interfaces between a plurality of the above-described columnar members made from a material for forming the above-described metal plate, and the above-described foil may be made from Sn, Pb, Ag, Bi, Zn, Al, or an alloy of at least two types of metals selected from them and may have a thickness of 50 µm or less.

Another example of methods for manufacturing the heat sink according to the above-described embodiments and the above-described modified examples is a method for manufacturing the heat sink provided with the above-described hollow radial slits and the method includes the steps of assembling an integrated composite columnar member by allowing columnar members made from a material for forming the above-described metal plate to adhere to tabular members made from a material for forming the buried metal to be buried into places corresponding to the places of formation of the above-described peripheral slits in the columnar members in an assembling step, contracting the above-described composite columnar member formed in the above-described assembling step by hydrostatic extrusion in a direction orthogonal to the axial direction of the above-described composite columnar member in an extrusion step, removing the above-described buried metal in the above-described composite columnar member contracted in the above-described extrusion step by heating, an acid-base reaction, or dissolving with a solvent to elute the above-described buried metal from the composite columnar member in an elution step, and slicing the above-described composite columnar member, from which the above-described buried metal has been removed in the above-described elution step, along the surface orthogonal to the axial direction thereof in a slice step.

Another example of methods for manufacturing the heat sink according to the above-described embodiments and the above-described modified examples is a method for manufacturing the above-described heat sink, and the method includes the step of forming the above-described peripheral slits in the above-described metal plate by die punching.

According to the above-described embodiments and the above-described modified examples, the mountain-like thermal distortion of the heat sink can be suppressed, peeling of the member to be bonded can be suppressed and, in addition, a reduction in thermal diffusibility can be suppressed.

The invention claimed is:

1. A heat sink having a surface which is to be bonded to a member to be bonded, the heat sink comprising:
   a metal plate having a thermal expansion coefficient larger than that of the member to be bonded, and
   buried metals;
   wherein the metal plate is provided with a center portion where the member to be bonded is bonded and a plurality of linear peripheral slits formed in a whirl-like radial manner and in such a way as to surround the center portion,
   the buried metals are buried in the plurality of linear peripheral slits, and
   the buried metals are plastically deformed by a shearing stress along the peripheral slits easily as compared with the metal plate.

2. The heat sink according to claim 1,
   wherein the heat sink having the other surface in contact with a cooling member, and
   wherein an outer edge portion of the surface on the cooling member side of the metal plate is fixed to the cooling member by at least three fixing portions present in the outer edge portion, and
   a portion excluding the fixing portions in the surface on the cooling member side of the metal plate is configured to be displaceable relative to the cooling member.

3. The heat sink according to claim 1,
   wherein the metal plate is provided with a plurality of linear center slits disposed in the center portion, and
   the plurality of center slits intersect with each other at a center of the center portion.

4. The heat sink according to claim 1,
   wherein the metal plate is made from pure Cu, pure Al, or an alloy thereof.

5. The heat sink according to claim 1,
   wherein the buried metal is made from Sn, Pb, Ag, Bi, Zn, Al, an alloy of at least two types of metals selected from them, pure Nb, or pure Ta.

6. The heat sink according to claim 1,
wherein the buried metal is made from a Zn—Al alloy or a Zn—Al based superplastic metal.

7. A heat sink having a surface which is to be bonded to a member to be bonded, the heat sink comprising:
a metal plate having a thermal expansion coefficient larger than that of the member to be bonded, and
buried metals;
wherein the metal plate is provided with a center portion where the member to be bonded is bonded and a plurality of peripheral slits formed in a whirl-like radial manner and in such a way as to surround the center portion,
the buried metals are buried in the plurality of peripheral slits, and
the buried metals are plastically deformed by a shearing stress along the peripheral slits easily as compared with the metal plate
wherein the plurality of peripheral slits have a curved shape.

8. A method for manufacturing the heat sink according to claim 1, the method comprising the steps of:
assembling an integrated composite columnar member by allowing columnar members made from a material for forming the metal plate to adhere to tabular members made from a material for forming the buried metal in an assembling step,
contracting the composite columnar member formed in the assembling step by hydrostatic extrusion in a direction orthogonal to the axial direction of the composite columnar member in an extrusion step, and
slicing the composite columnar member contracted in the extrusion step along the surface orthogonal to the axial direction thereof in a slice step.

9. The method for manufacturing the heat sink, according to claim 8,
wherein the metal plate is made from pure Cu,
the buried metal is made from pure Nb or pure Ta, and
the extrusion temperature of the hydrostatic extrusion is a temperature within the temperature range of 600° C. to 900° C.

10. The method for manufacturing the heat sink, according to claim 8,
wherein the metal plate is made from pure Al,
the buried metal is made from pure Ta, and
the extrusion temperature of the hydrostatic extrusion is a temperature within the temperature range of 200° C. to 600° C.

11. The method for manufacturing the heat sink, according to claim 8,
wherein the metal plate is made from pure Cu or pure Al,
the buried metal is made from Sn, Pb, Ag, Bi, Zn, Al, or an alloy of at least two types of metals selected from them, and
the extrusion temperature of the hydrostatic extrusion is 200° C. or lower.

12. The method for manufacturing the heat sink, according to claim 8,
wherein the extrusion temperature of the hydrostatic extrusion is 200° C. or lower,
in the assembling step, foil is sandwiched at the interfaces between a plurality of the columnar members made from a material for forming the metal plate, and
the foil is made from Sn, Pb, Ag, Bi, Zn, Al, or an alloy of at least two types of metals selected from them and has a thickness of 50 μm or less.

13. A method for manufacturing the heat sink according to claim 1, the method comprising the steps of:
assembling an integrated composite columnar member by allowing columnar members made from a material for forming the metal plate to adhere to tabular members made from a material for forming the buried metal to be buried into places corresponding to the places of formation of the plurality of linear peripheral slits in the columnar members in an assembling step,
contracting the composite columnar member formed in the assembling step by hydrostatic extrusion in a direction orthogonal to the axial direction of the composite columnar member in an extrusion step,
removing the buried metal in the composite columnar member contracted in the extrusion step by heating, an acid-base reaction, or dissolving with a solvent to elute the buried metal from the composite columnar member in an elution step, and
slicing the composite columnar member, from which the buried metal has been removed in the elution step, along the surface orthogonal to the axial direction thereof in a slice step.

14. A method for manufacturing the heat sink according to claim 1, the method comprising the step of:
forming the plurality of linear peripheral slits in the metal plate by die punching.

* * * * *